(12) United States Patent
Shin et al.

(10) Patent No.: US 6,395,608 B2
(45) Date of Patent: May 28, 2002

(54) HETEROJUNCTION BIPOLAR TRANSISTOR AND ITS FABRICATION METHOD

(75) Inventors: Jin Ho Shin, Seoul; Tae Yun Lim, Kyungki-do; Hyung Wook Kim, Seoul, all of (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/770,503

(22) Filed: Jan. 29, 2001

Related U.S. Application Data

(62) Division of application No. 09/235,765, filed on Jan. 25, 1999, now abandoned.

(30) Foreign Application Priority Data

Jan. 26, 1998 (KR) .............................................. 98-2347

(51) Int. Cl.[7] ............................................ H01L 21/331
(52) U.S. Cl. ........................ 438/319; 438/312; 438/318; 438/320
(58) Field of Search ................................ 438/312, 318, 438/320, 319

(56) References Cited

U.S. PATENT DOCUMENTS

| | | | |
|---|---|---|---|
| 5,345,097 A | 9/1994 | Nakagawa | 257/198 |
| 5,625,206 A | 4/1997 | Chandrasekhar et al. | 257/198 |
| 5,729,033 A | 3/1998 | Hafizi | 257/198 |

*Primary Examiner*—Long Pham
(74) *Attorney, Agent, or Firm*—Fleshner & Kim, LLP.

(57) ABSTRACT

A heterojunction bipolar transistor and its fabrication method is disclosed. The heterojunction bipolar transistor includes a substrate; a collector layer formed to have a ledge or MESA on the substrate; a collector electrode formed on the collector layer surrounding the ledge; a base layer formed on the ledge of the collector layer; an ohmic cap layer on the emitter layer; an emitter layer formed in the center of the base layer; an emitter electrode formed on the ohmic cap layer; a base electrode formed on the base layer surrounding the emitter electrode; an insulating layer formed to cover the base electrode and to overlay on the insulating layer; a metal wire formed to cover the emitter electrode; and an air bridge brought in contact with the metal wire and electrically connected to an external pad lying on an ion-implanted isolation region.

13 Claims, 35 Drawing Sheets

HETEROJUNCTION BIPOLAR TRANSISTOR AND ITS FABRICATION METHOD

This application is a Divisional of application Ser. No. 09/235,765 filed Jan. 25, 1999 now abandoned.

BACKGROUND OF THE INVENTION

1. Field of the Invention

The present invention relates to a bipolar transistor and more particularly to a fully self-aligned heterojunction bipolar transistor (hereinafter, referred to as "HBT") with an overlay on the mask layout between the emitter and base electrodes.

2. Discussion of Related Art

Generally, HBTs are one of the most important transistors for the microwave frequency band which requires high speed characteristics. Both the emitter and the base of the HBTs are semiconductors, the emitter having a large energy band gap and the base having a small energy band gap. The difference in the energy band gap enables the HBTs to maintain a high current gain and to reduce the base series resistances by heavily doping the base with impurities. As a result, the HBTs have high speed characteristics.

The HBTs are especially used in the field of power amplifiers over 1 GHz because HBTs have a high current density and a good linear property. The HBTs are also being used as a power amplifier in the 900 MHz digital CDMA and the 1.8 GHz PCS telephone, and are expected to be used in later mobile communication services such as IMT2000. A high speed is essential to the HBTs for later use in the field of millimeter waves above 30 GHz such as Local Multipoint Distribution Service (LMDS), Automotive Car Collision Avoidance Radar (ACCAR), Wireless Local Area Network (WLAN), as well as in the field of 1–2 GHz mobile communication.

Basically, a figure-of-merit indicating the high speed characteristic of a transistor is the maximum usable oscillation frequency $f_{max}$. The maximum usable oscillation frequency of HBTs used in the latest mobile communication telephone is typically below 30 GHz. For use of HBTs in frequency environments above 30 GHz, the maximum usable oscillation frequency must be greater than 100 GHz. Recently, HBTs with a maximum usable oscillation frequency above 100 GHz have been produced due to scale-down.

The maximum usable oscillation frequency $f_{max}$ of an HBT may be expressed by Equation 1 below:

$$f_{max} = \left[ \frac{f_t}{8 \times \pi \times R_b \times C_{bc}} \right]^{0.5} \quad \text{[Equation 1]}$$

where $f_t$ is the current gain cut-off frequency, $R_b$ is the base series resistance, and $C_{bc}$ is the electrostatic capacitance of a depletion layer between the base and collector. The $R_b$ value of HBT is low because the base is heavily doped in the HBTs, and is much smaller than the $R_b$ of a silicon Bipolar Junction Transistor (BJT). The $f_t$ value is inversely proportional to the transit time of charges (carriers) flowing from the emitter to the collector of a transistor and is dependent upon the vertical epitaxy structure of the HBT, without being affected by the layout of a mask. The $f_t$ value may be expressed as follows:

$$\frac{1}{2 \times \pi \times f_t} = k \times \frac{T}{q \times I_E} \times (C_{jbe} + C_{bc}) + \tau_b + \tau_{bcscr} \quad \text{[Equation 2]}$$

where $k \times T/q$ is the thermal voltage, $I_E$ is the emitter current, $C_{jbe}$ is the electrostatic capacitance of a depletion layer between the emitter and the base, $\tau_b$ is the base transit time, and $\tau_{bcscr}$ is the running time in a depletion layer between the base and the collector. To increase $f_{max}$, the $f_t$ value must be enhanced while reducing the $R_b$ and $C_{bc}$ values.

FIGS. 1a and 1b are plane and cross-sectional views of a MESA type HBT in the related art with a self-aligned emitter and base electrodes. The effects of the transistor structure on the maximum usable oscillation frequency will be described with reference to FIGS. 1a and 1b.

The maximum usable oscillation frequency $f_{max}$ is largely proportional to $1/W^{1/2}$ because $R_b$ is proportional to $1/L$ while $C_{bc}$ is proportional to $W \times L$. Thus, the width $W_E$ of the emitter electrode 14 and the width W of the base-collector PN junction must be reduced to enhance the maximum usable oscillation frequency on the plane structure of a transistor. Accordingly, if $f_t$ stays constant, the emitter and base electrodes 14 and 15 must be self-aligned such that $L_{BE}$ is minimized to lower the base resistance $R_b$, and W and $W_E$ are minimized to decrease the base-collector electrostatic capacitance $C_{bc}$.

The HBT shown in FIGS. 1a and 1b uses an air bridge 12 connecting the emitter electrode 14 to the exterior of the transistor. However, the air bridge 12 limits the reduction of the width $W_E$ of emitter electrode 14. Particularly, the width $W_E$ of emitter electrode 14 must be sufficiently greater than the width $W_{air}$ of an air bridge such that $W_E > W_{air} + \alpha$, where $\alpha \approx 2.0 \, \mu m$. If the air bridge is misaligned and extends out of the emitter electrode 14, an electrical short occurs between emitter and base electrodes 14 and 15. Thus, the HBT structure shown in FIGS. 1a and 1b limits the reduction of the widths $W_E$ and W, and the maximum usable oscillation frequency is difficult to raise.

For the HBT operating in the millimeter wave band greater than 30 GHz, the desirable width of emitter electrode is below 1 $\mu m$ and a different HBT structure is required. Generally, the second HBT structure, shown in FIG. 2, is made using a method of reducing the widths $W_E$ and W through a metal wiring process utilizing planarization of polyimide 30. This process allows a fabrication of a HBT used in the millimeter wave band with small widths $W_E$ and W, because the polyimide 30 electrically isolates the emitter and the base electrodes 14 and 15 even if the emitter electrode 14 is formed with a metal having a wiring width greater than $W_E$. However, controlling the fabrication process for this structure is difficult.

The fabrication process of HBTs shown in FIGS. 1 and 1b and FIG. 2 will next be described. FIGS. 3a–3h are cross-sectional views illustrating a fabricating process for the HBT shown in FIGS. 1a and 1b. FIGS. 4a–4e are cross-sectional views illustrating a fabricating process for the HBT shown in FIG. 2.

As shown in FIG. 3a, a sub-collector layer 21, a collector layer 20, a base layer 16, an emitter layer 19 and an ohmic cap layer 18 are sequentially formed on a semiconductor substrate 22 by means of epitaxial growth. Next, an emitter electrode 14 consisting of a metal is formed in a defined profile on the resulting structure. As shown in FIG. 3b, the emitter electrode 14 is used as a mask in etching the structure so as to expose the base layer 16. The etching technique utilized is typically reactive ion etching or wet etching. As a result of the etching process, an undercut profile as shown in part B of FIG. 3b is formed.

After forming a defined photoresist pattern at a portion including the emitter electrode 14, base metal layers 15 and 15' are deposited on the entire surface and lifted off to form a base electrode 15, as shown in FIG. 3c. The base electrode 15 is self-aligned around the emitter electrode 14 due to the undercut B formed by the etching step. This lowers the parasitic resistance $R_b$ of the base. The thickness t of the base electrode 15 must be smaller than the sum (indicated by "s" of FIG. 3b) of the emitter layer 19 thickness and the ohmic cap layer 18 thickness of the emitter.

As shown in FIG. 3d, the base layer 16 and the collector layer 20 are etched to define a base-collector PN junction C. Subsequently, a collector electrode 17 is formed in a defined profile on the sub-collector layer 21, as shown in FIG. 3e. Following the formation of the collector electrode 17, ions are injected into the sub-collector layer 21 to form an insulating layer 10, shown in FIG. 3f. The injected ions are boron. A pad 11 is formed with a wiring metal, as shown in FIG. 3g and an air bridge 12 is formed to connect the emitter electrode 14 with the external pad 11 of the transistor, which completes the HBT, as shown in FIG. 3h.

Referring to FIG. 4a, the procedures as described above in reference to FIGS. 3a–3g are repeated in the fabrication of the HBT shown in FIG. 2. Subsequently, the entire surface is coated with a polyimide 30, shown in FIG. 4b. The polyimide is formed in the plane profile irrespective of the unevenness of the substrate because of its surface tension peculiar to the liquid. However, to planarize the polyimide 30, the thickness "u" must be at least two times greater than the maximum height "v" of the ledge of the substrate.

After the polyimide 30 is coated with a thickness sufficient to planarize the surface, the surface of polyimide 30 is etched continuously until the base metal layer 15' is exposed on the emitter electrode 14, shown in FIG. 4c. The etching must be stopped accurately at the moment the base metal layer 15' is exposed. The etching technique utilized is typically reactive ion etching (RIE) using oxygen plasma. As shown in FIG. 4d, a contact hole 25 is perforated to expose a portion of the pad 11. Thereafter, a wiring metal 12' is used to connect the emitter electrode 15' and the pad 11 to complete the HBT, shown in FIG. 4e.

The HBTs in the related art have several problems. First, it is difficult to control the exact point in time to stop etching the polyimide. An excessive etching causes an electrical short at the emitter-base junction during the later metal wiring step. On the other hand, the etching is not sufficiently performed, the emitter electrode 14 will be electrically opened.

Second, the etching has to be stopped at a moment the emitter electrode is exposed in the HBT fabrication process of in the related art. However, it is difficult to automatically stop the etching utilizing an end point detector in the RIE equipment or to observe the end point with a microscope, because the emitter electrode is one of the smallest portion of the substrate.

Third, a separate mask is required to define the base-collector PN junction, which makes it difficult to minimize the width of the base-collector PN junction in the manner of self-alignment. Fourth, the HBT fabrication process in the related art uses an emitter surrounding band (a structure depleted around the emitter and remaining the thin emitter) or a surface-passivating depleted emitter ledge (referred to as "ledge structure"). This increases the width of the base-collector PN junction since a separate mask is required to prepare such a structure.

SUMMARY OF THE INVENTION

Accordingly, an object of the present invention is to solve at least the problems and disadvantages of the related art.

An object of the present invention is to provide a HBT with a reduced base-collector junction capacitance and a high speed characteristic by a scale-down of the areas of the emitter and the base-collector junction.

Another object of the present invention is to provide an HBT by a simplified fabrication process.

A further object of the present invention is to provide an HBT with a high product yield and a prolonged life time.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, etching a planarized insulating layer is easily stopped by reducing the thickness of the planarized insulating layer. As shown in FIG. 6f, reducing the thickness of the insulating layer is possible because the step difference of the surface is decreased by depositing a first insulating layer 300 prior to the deposition of the planarized insulating layer. The first insulating layer is formed by depositing a material such as silicon oxide ($SiO_x$) or silicon nitride ($SiN_x$).

Consequently, the etching can be stopped automatically with an end point detector because an oxygen reactive ion etching (RIE) of the polymide (planarized insulating layer) 220 barely etches the first insulating layer 300 such as $SiO_x$ or $SiN_x$. Furthermore, the first insulating layer 300 has an area large enough to observe the etching end point of the planarized insulating layer, enhancing the accuracy of the end point. The planarized insulating layer 220 and base metal layer 140' on top of the emitter electrode are used as a mask in etching a base-collector PN junction in a manner of self-alignment.

In an another embodiment of the present invention, a first insulating layer is formed on the sidewall of the emitter in a manner of self-alignment and is used as an etching mask to form a depleted emitter ledge structure 210' of FIG. 11f around the emitter layer 210. This ledge reduces the surface recombination 1/f noise at the top surface of the base 230 which causes a low frequency noise and decreases the non-radiative recombination current at this portion. This reduces the defect occurrence in the base layer and enhances the life time of the HBT. Unlike the related art requiring a separate mask in the fabrication of the HBT, the present invention can prepare the ledge in a manner of self-alignment by use of an insulating layer sidewall 300' that can be formed automatically in the step of etching the first insulating layer, as shown in FIGS. 11e and 12a.

BRIEF DESCRIPTION OF THE ATTACHED DRAWINGS

The invention will be described in detail with reference to the following drawings in which like reference numerals refer to like elements wherein.

DETAILED DESCRIPTION OF PREFERRED EMBODIMENT

Reference will now be made in detail to the HBT and its fabrication method according to the preferred embodiments of the present invention, examples of which are illustrated in the accompanying drawings.

Figure 1A:
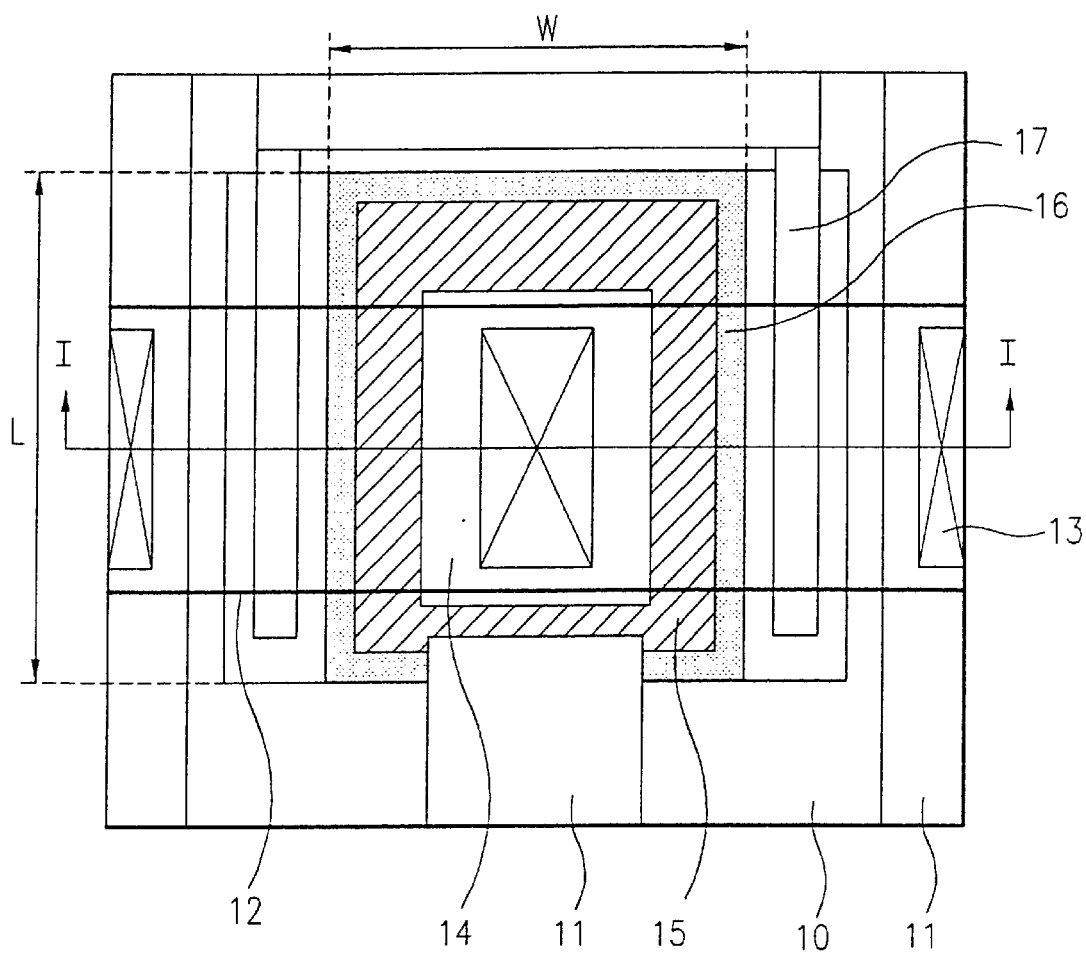
FIG. 1a is a plane view of a general HBT in the related art.
Figure 1B:
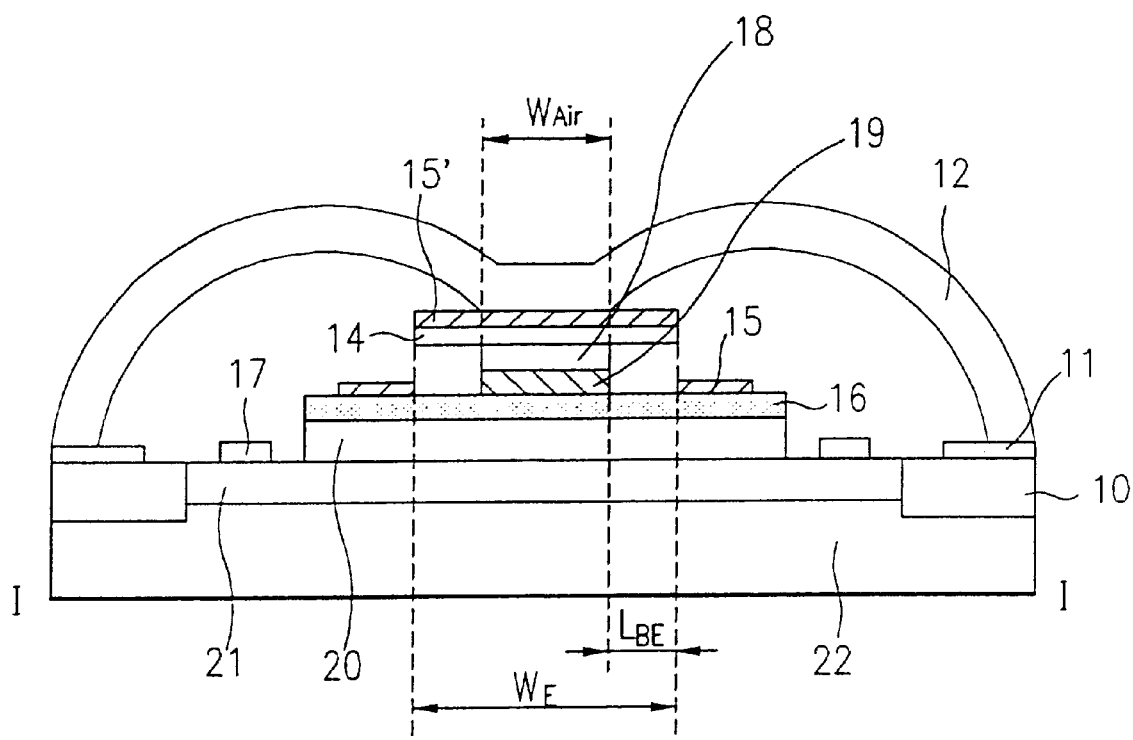
FIG. 1b is a cross-sectional view showing one structure of HBT of FIG. 1a taken along the line I—I.
Figure 2:
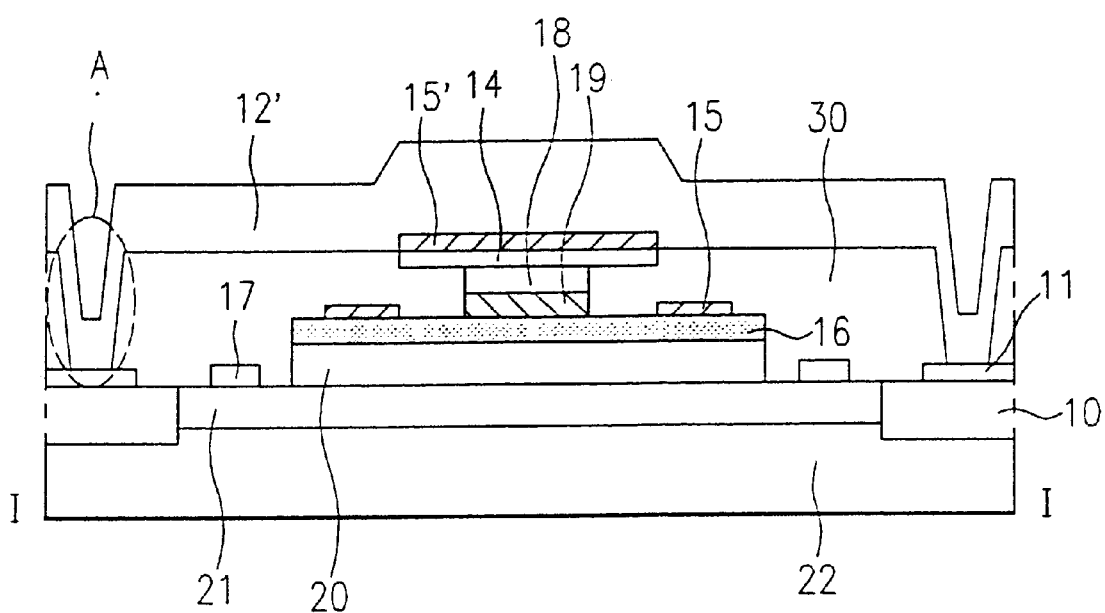
FIG. 2 is a cross-sectional view showing another structure of HBT of FIG. 1a taken along I—I.
Figure 3A:
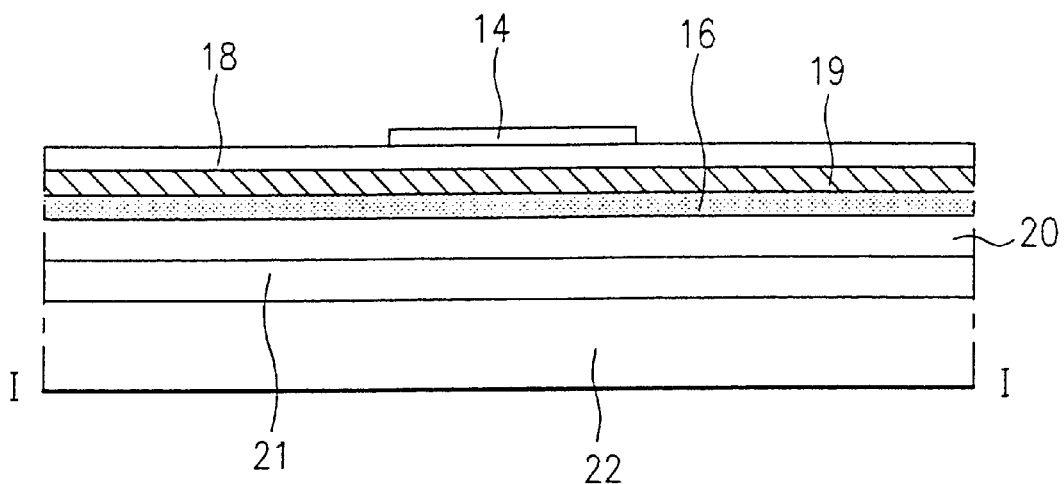
FIGS. 3a to 3h are cross-sectional views illustrating a fabrication process for the HBT in FIG. 1b.
Figure 3B:
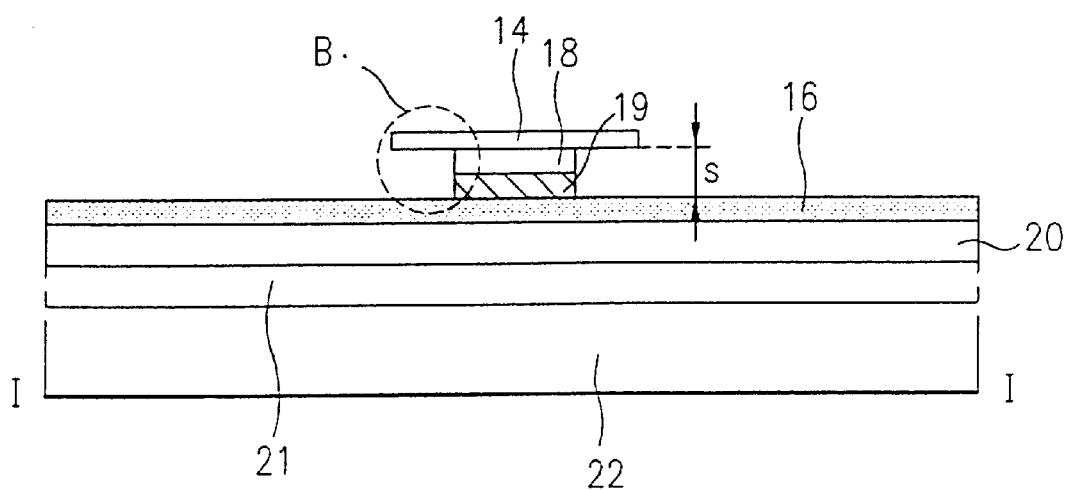
Figure 3C:
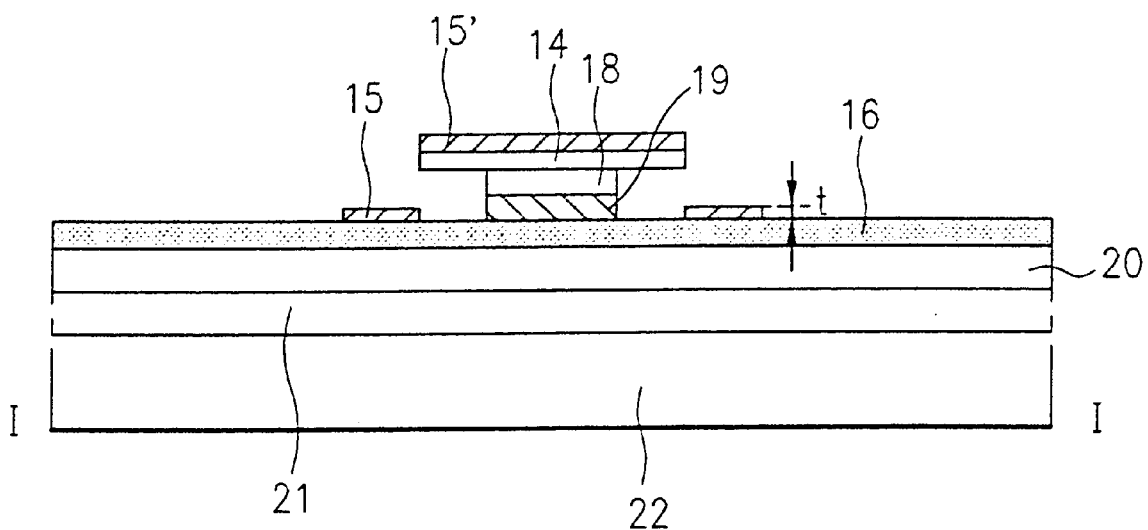
Figure 3D:
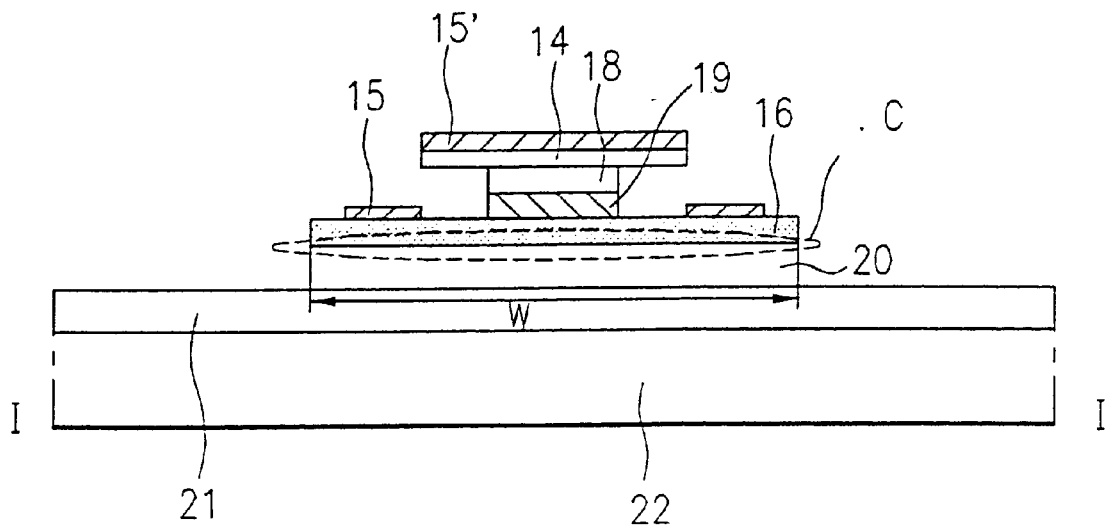
Figure 3E:
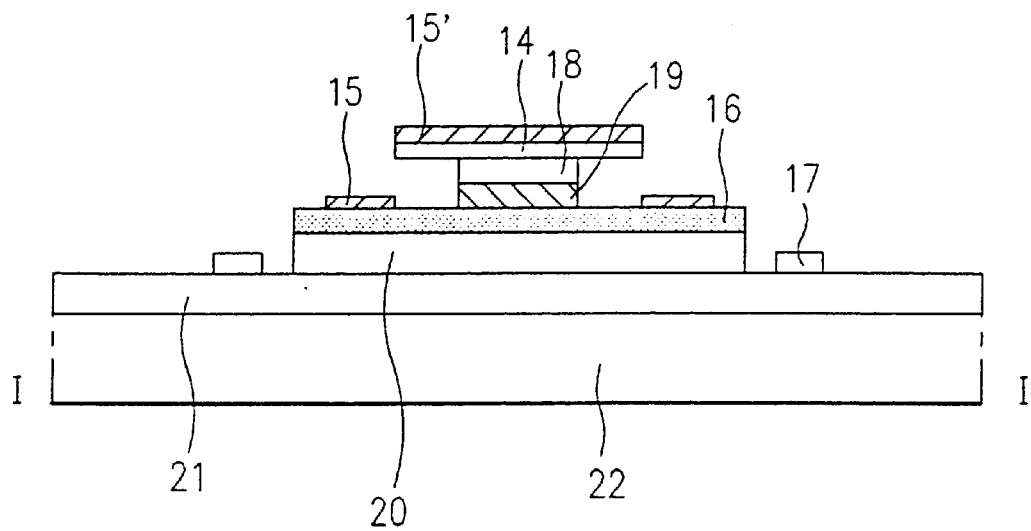
Figure 3F:
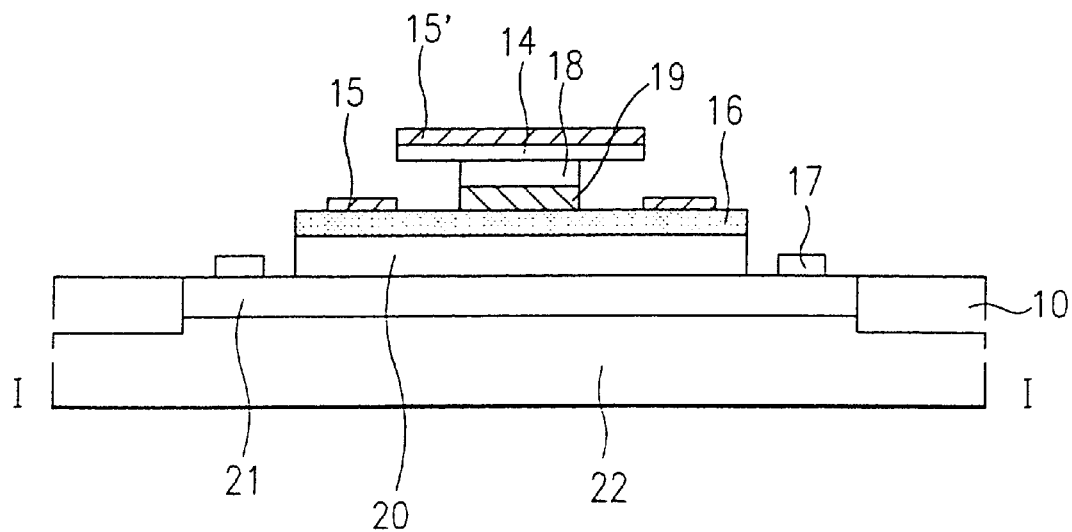
Figure 3G:
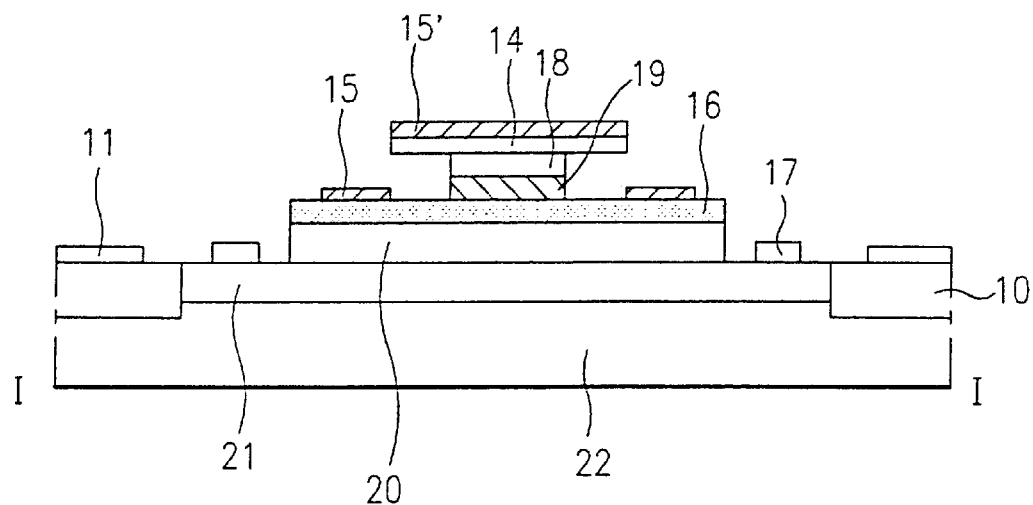
Figure 3H:
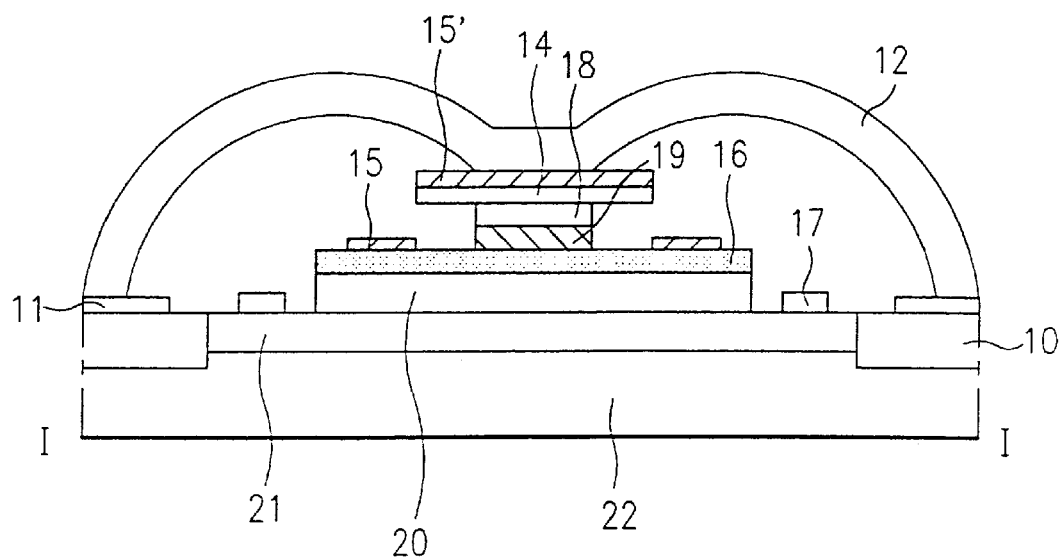
Figure 4A:
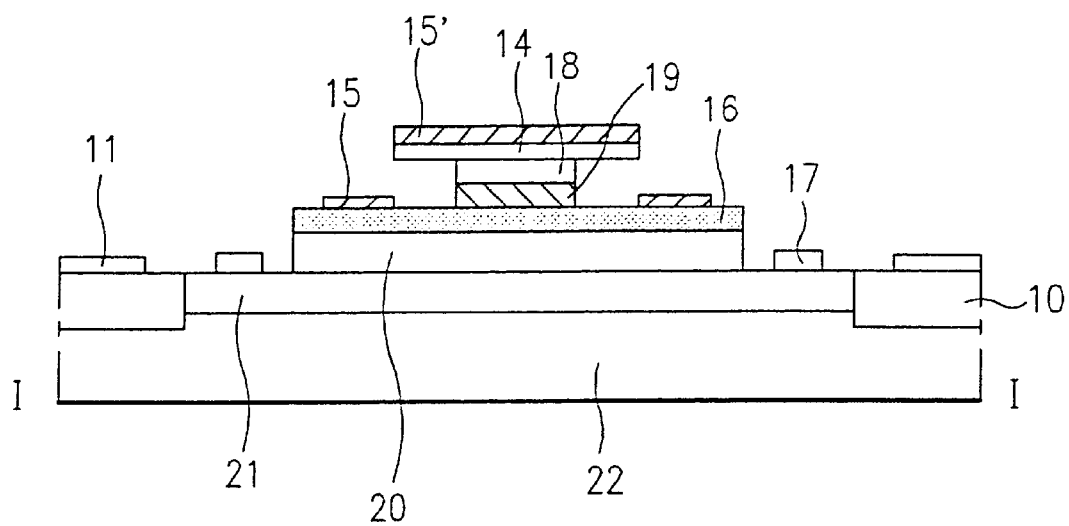
FIGS. 4a to 4e are cross-sectional views illustrating a fabrication process for the HBT in FIG. 2.
Figure 4B:
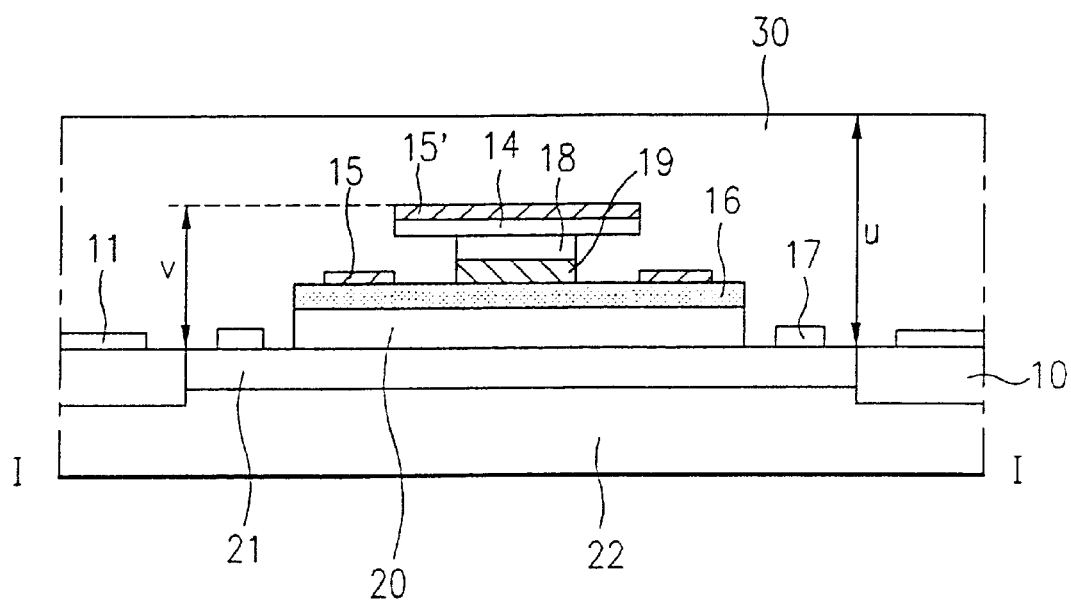
Figure 4C:
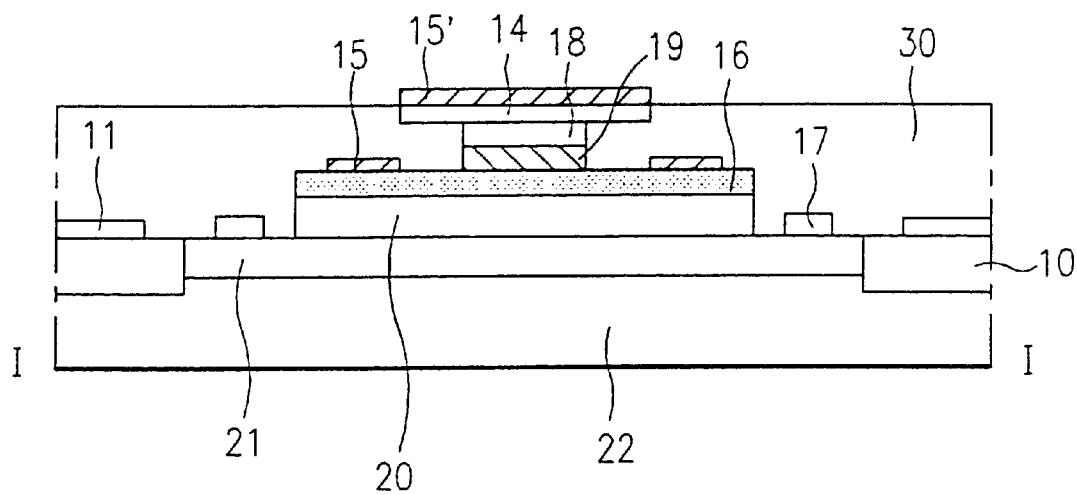
Figure 4D:
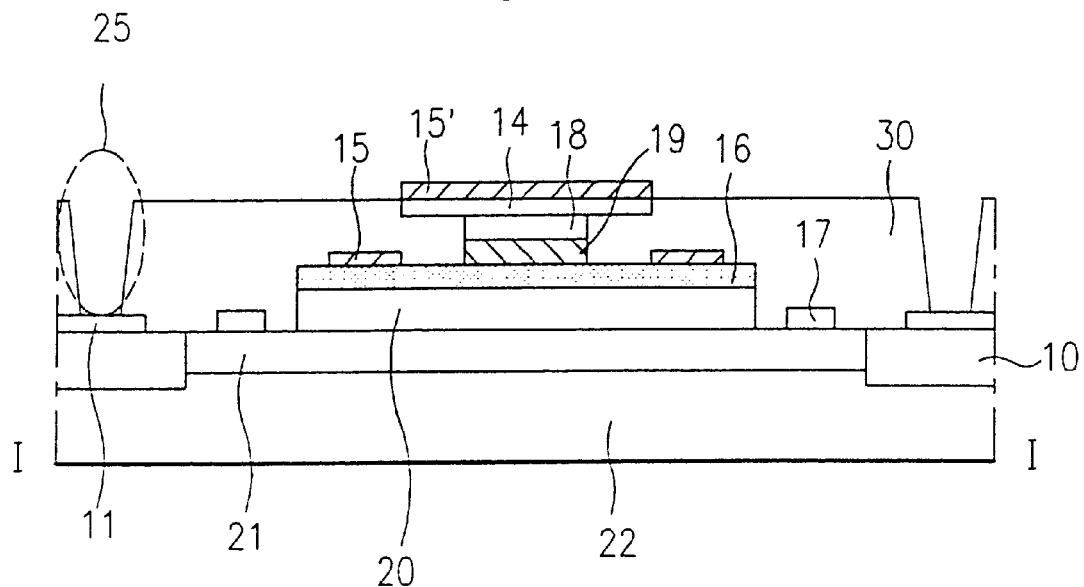
Figure 4E:
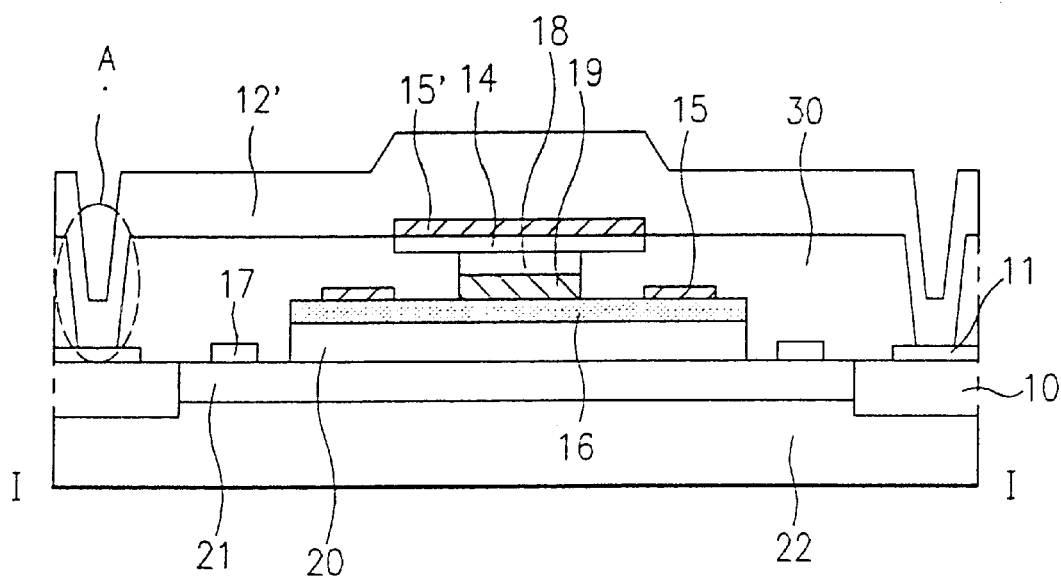
Figure 5A:
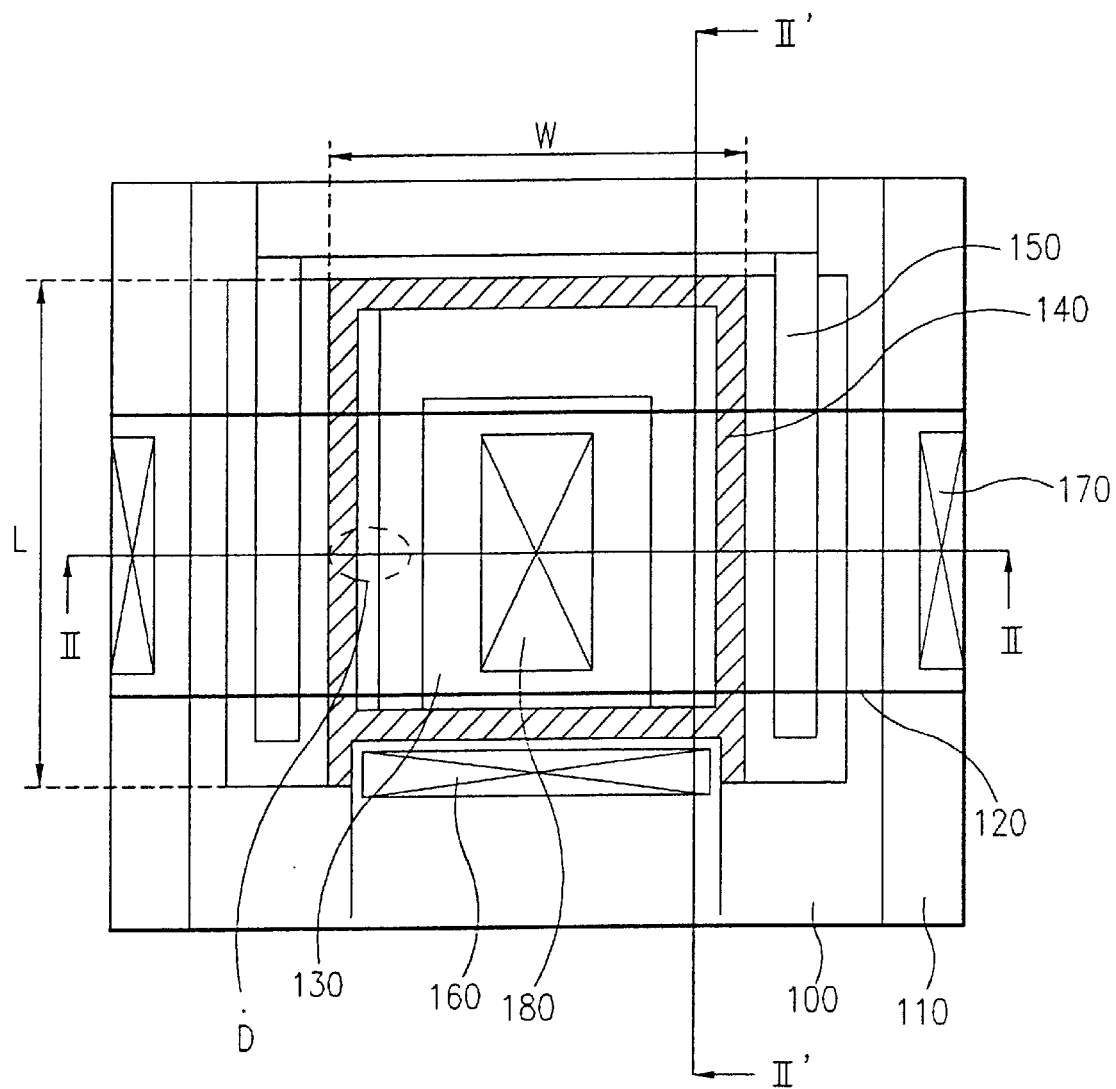
FIG. 5a is a plane view of the HBT according to the present invention.
Figure 5B:
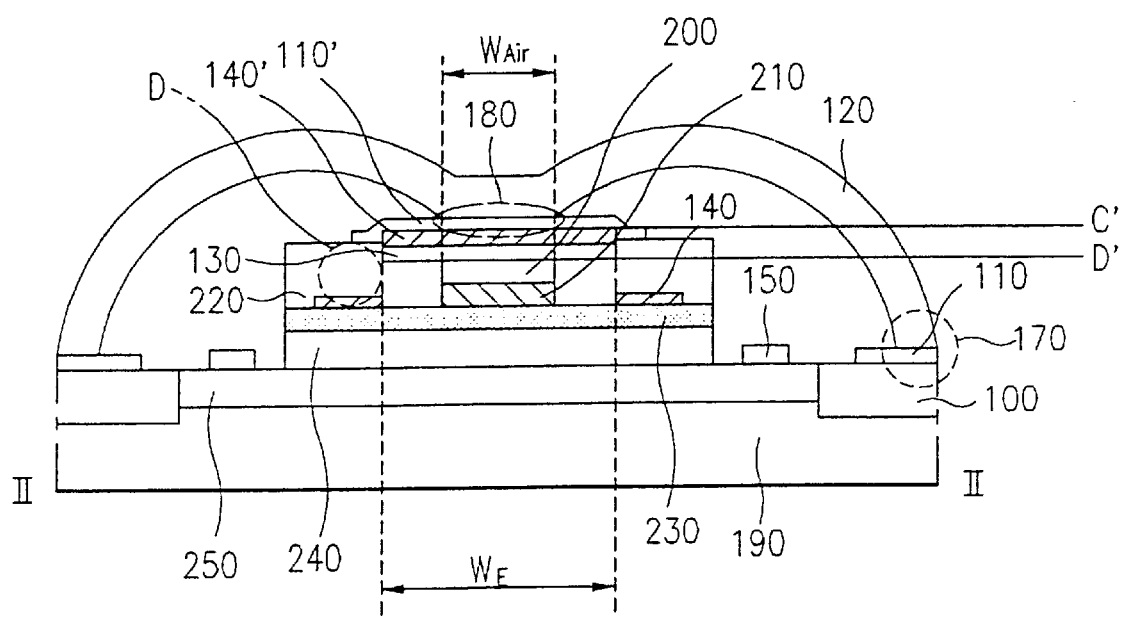
FIG. 5b is a cross-sectional view of FIG. 5a taken along the line II—II.

FIG. 5a is a plane view of an HBT according to a first embodiment of the present invention, and FIG. 5b is a cross-sectional view of the HBT taken along the line II—II. A substrate 190 is composed of a normal semi-insulating semiconductor substrate and a sub-collector layer 250 is formed on the substrate 190. An insulating layer 100 is formed by implanting ions into the substrate as deep as a predetermined depth with respect to the sub-collector layer. A collector electrode 150 is formed in a defined profile on a portion of the sub-collector layer 250. A base layer 230 is deposited on a collector layer 240. An emitter layer 210 is formed in a defined profile on a part of the base layer 230, while an ohmic cap layer 200 is formed in the same profile as the emitter layer 210 on the emitter layer.

In the present invention, a base electrode 140 is formed in a defined profile at a position separated by a predetermined distance from the edge of the emitter layer on the base layer. An emitter electrode 130 covers the top surface of the ohmic cap layer 200. Namely, the emitter electrode 130 extends over the boundary of the ohmic cap layer 200. A base metal layer 140' consists of the same material as the base electrode 140 and is formed on the emitter electrode 130. An electrode metal 110' is disposed on the base metal layer 140' over the emitter electrode 130. The electrode metal may or may not consist of the same material as a pad metal 110, and surrounds the emitter electrode 130.

A second insulating layer 220 is formed higher than the ohmic cap on the base layer and the base electrode. This insulating layer fills the space between the emitter and the base electrodes to electrically insulate the portion between the emitter electrodes 130, 140', 110' and the base electrode 140. The pad metal 110 has a defined profile on the insulating layer formed by implanting ions into the sub-collector layer 250. The electrode metal 110' is formed on the insulating layer 220 and covers the base metal layer 140' formed on the emitter electrode 130. An air bridge 120 connects the electrode metal 110' and the pad metal 110.

In addition, the present invention is structured such that the insulating layer 220 is higher than the top surface of the ohmic cap 200 and lower than the top surface of the base metal layer 140' on top of the emitter electrode 130. The height of the insulating layer is exactly controlled to be between C' and D' shown in FIG. 5b. This can be achieved by using another insulating layer, which is barely etched during the etching of the insulating layer 220. This process will be further explained below.

Figure 6A:
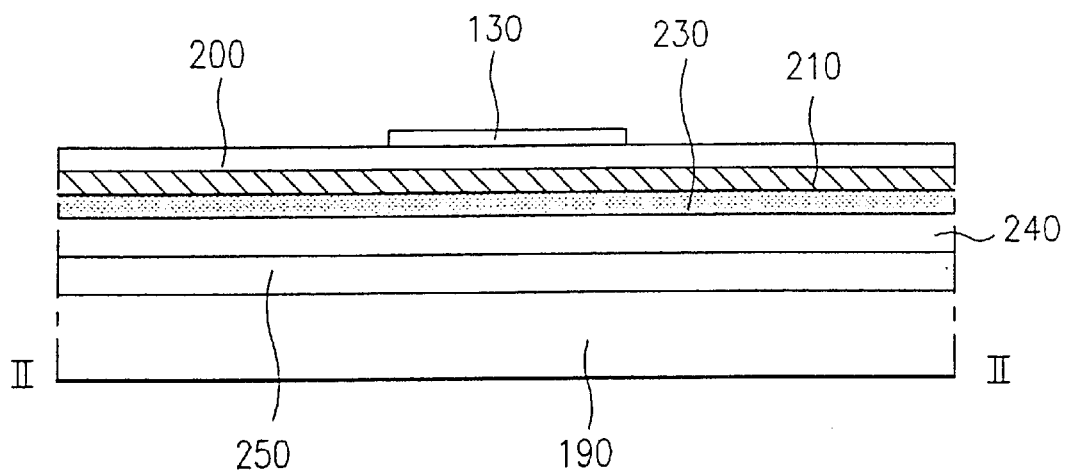
FIGS. 6a to 6j are cross-sectional views illustrating a fabrication process for the HBT in FIG. 5b.
Figure 6B:
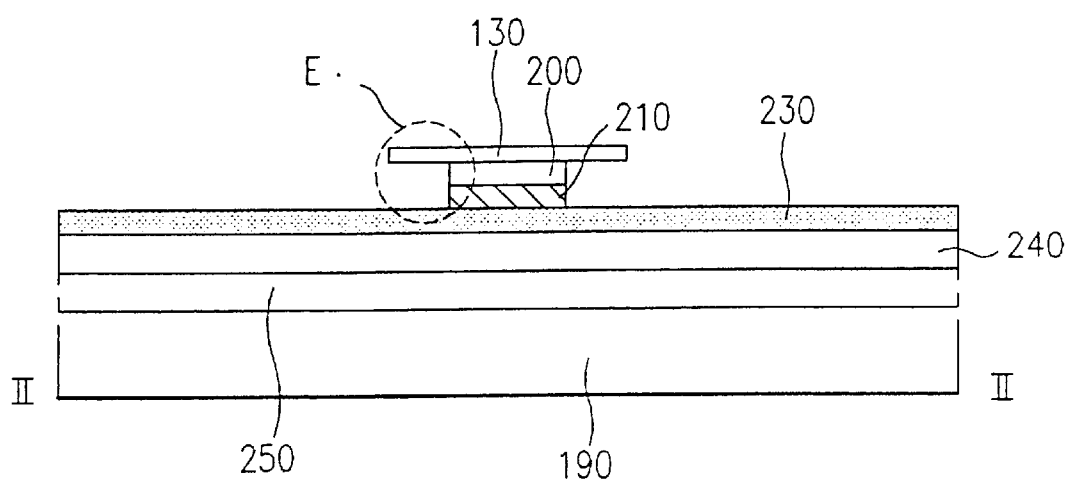

FIGS. 6a–6j are cross-sectional views illustrating a fabrication process for the HBT according to one embodiment of the present invention. A sub-collector layer 250, a collector layer 240, a base layer 230, an emitter layer 210 and an ohmic cap layer 200 are sequentially and epitaxially grown on a substrate 190, shown FIG. 6a. An emitter metal is lift-off patterned to form the emitter electrode 130. As shown in FIG. 6b, the emitter electrode 130 is used as a mask in etching the ohmic cap layer 200 and the emitter layer 210, exposing the underlying base layer 230. First, the ohmic cap layer is etched by a reactive ion etching technique using a Cl and F-based mixed gas plasma. Subsequently, a wet etching is performed to etch the emitter layer 210. This selective etching of the ohmic cap layer 200 by the reactive ion etching causes a controllable undercut E shown in FIG. 6b.

Figure 6C:
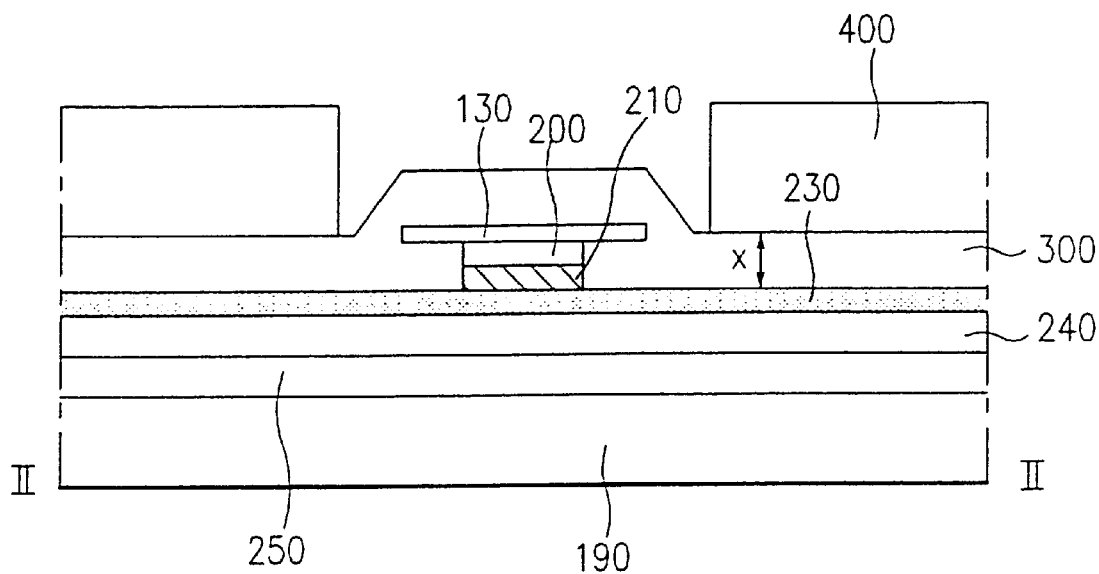

After the base layer 230 is exposed, a first insulating layer 300 (e.g., silicon oxide layer or silicon nitride layer) is deposited on the entire surface, filling the undercut of the emitter electrode 130, shown in FIG. 6c. The deposition thickness "x" of the first insulating layer 300 is smaller than the height from the base layer 230 to the top of the emitter electrode 130 and larger than the height from the base layer 230 to the ohmic cap layer 200. The height "x" corresponds to the height of planarized insulating layer 220 of HBT in FIG. 5b.

A photoresist 400 is patterned in a defined profile on the first insulating layer 300. The patterned photoresist 400 is used as a mask in etching the first insulating layer 300 to expose a portion of the base layer 230, the emitter electrode 130, the ohmic cap layer 200 and the emitter layer 210.

Figure 6D:
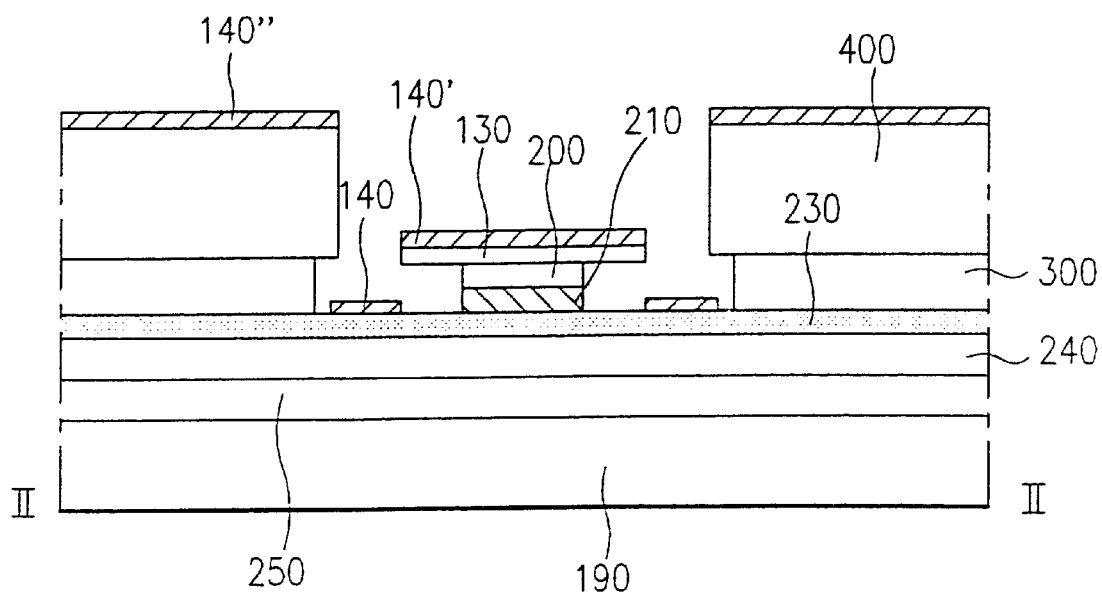
Figure 6E:
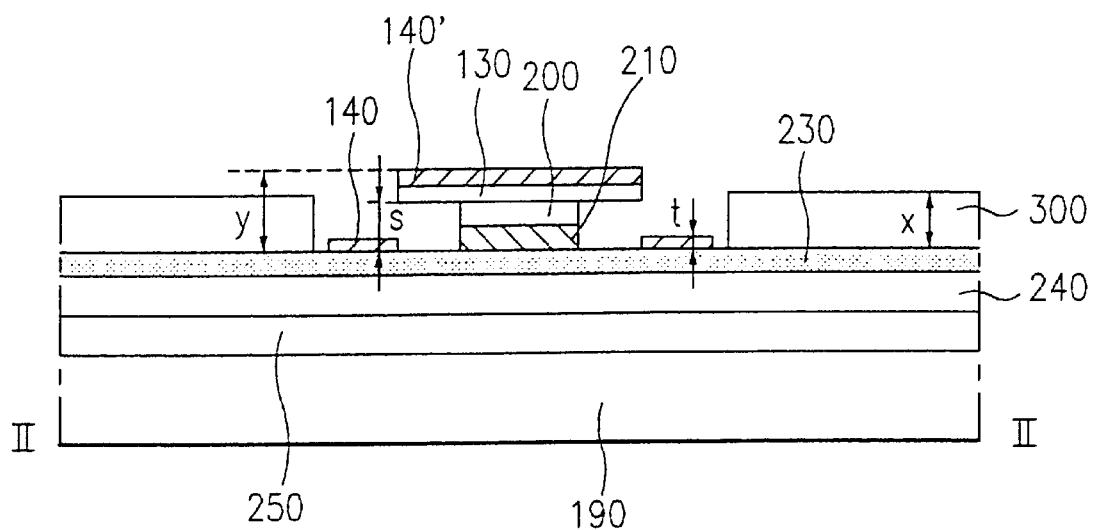
Figure 6F:
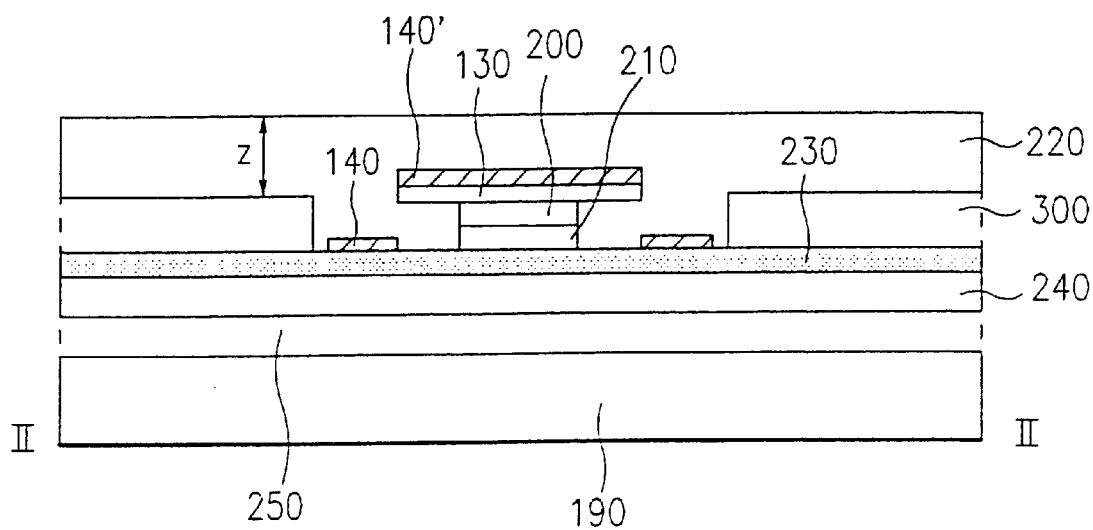
Figure 6G:
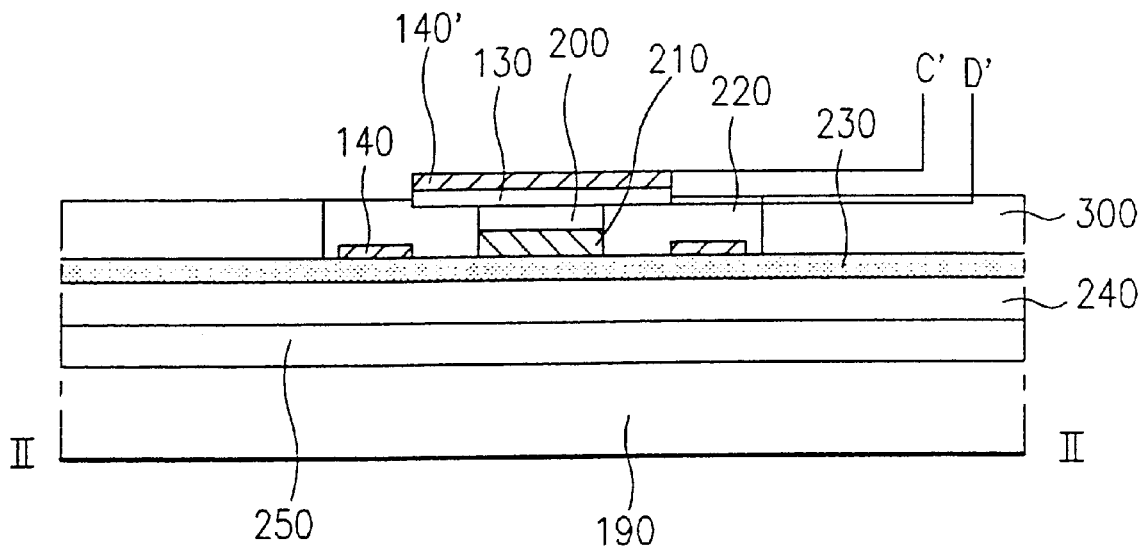

As shown in FIG. 6d, a base metal is deposited on the entire surface to form the base electrode 140 on the base layer 230 and to form the base metal layer 140' on the emitter electrode 130. The pattern of base electrode 140 is self-aligned by the emitter electrode 130 and the photoresist 400. After forming the base electrode 140 formed, the photoresist 400 and the overlying base metal layer 140' are removed as shown in FIG. 6e. A second insulating layer 220 is then deposited evenly as shown in FIG. 6f. A Polyimide is used for the planarization of the second insulating layer 220.

As the top surface of the substrate is planarized with the second insulating layer 220, the second insulating layer 220 is gradually etched until the top surface of the first insulating layer 300 is exposed. The etching technique for etching the second insulating layer 220 is a reactive ion etching using an oxygen plasma. The control of the etching speed and thickness utilizing a reactive ion etching is easier than the wet etching. Thus, etching of the second insulating layer 220 is stopped when the top surface of the first insulating layer 300 is exposed while etching with the reactive ion etching technique. The range of the termination point for the etching of the second insulating layer 220 is between C' and D' of FIG. 6g. This point is typically between the upper and bottom surfaces of the emitter electrode 130.

Figure 6H:
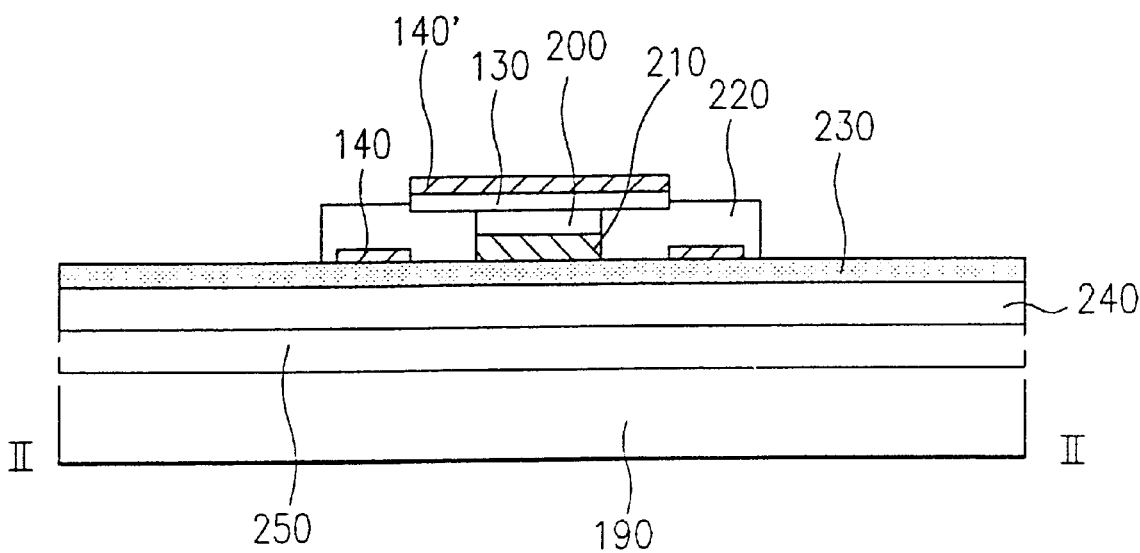

During this process, the first insulating layer 300 plays a role as an indicator to stop the etching the insulating layer 220, thereby enhancing the reliability of the process. Thus, the remainder of the first insulating layer 300 is removed, as shown in FIG. 6h.

Figure 6I:
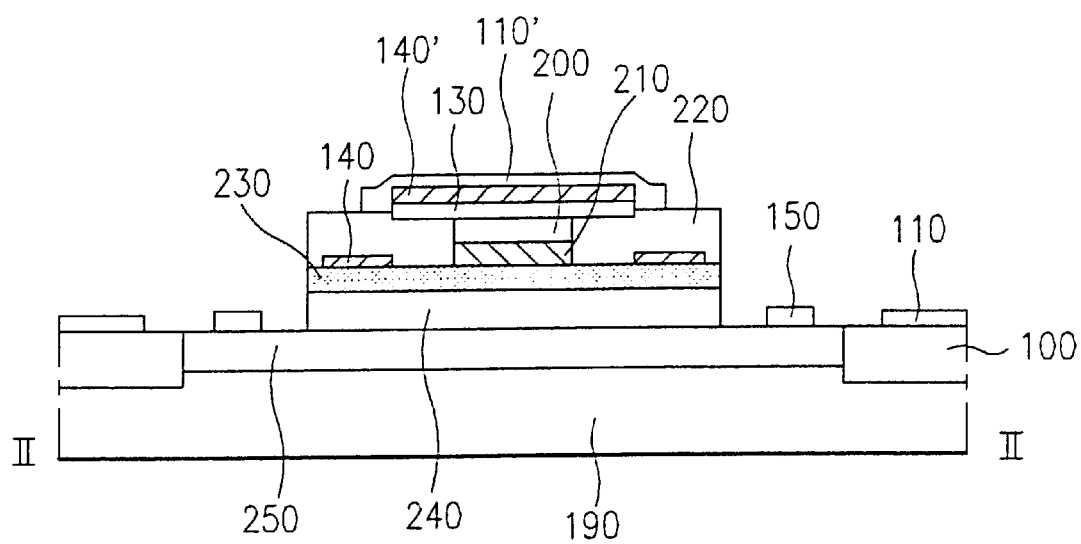

The second insulating layer 220 and the emitter electrode 130 are used as a mask in etching the base layer 230 and the collector layer 240 to expose the sub-collector layer 250, as shown in FIG. 6i. Subsequently, the collector electrode 150 is formed on the sub-collector layer 250 and ions are injected into a portion of the sub-collector layer 250 to form the insulating layer 100. The injection depth of the ions is controlled to penetrate into a portion of the substrate under the sub-collector layer 250.

Figure 6J:
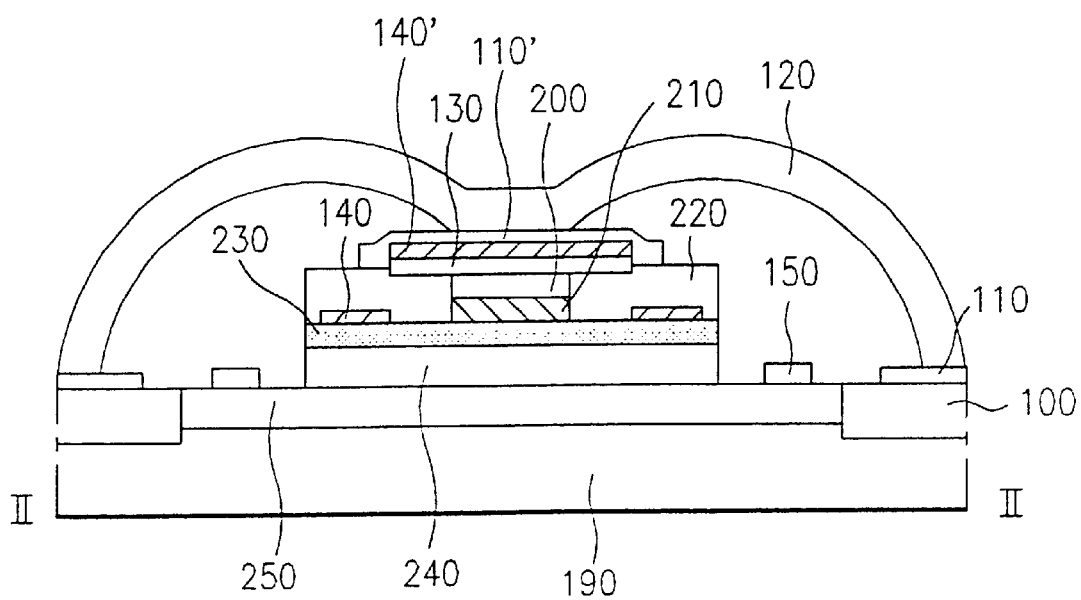

The electrode metal 110' is formed surrounding the base metal layer 140' and the emitter electrode 130 on the second insulating layer 220, and at the same time the pad metal 110 is formed on the ion injected insulating layer 100. The electrode metal 110' and the pad metal 110 may or may not consist of the same material. Finally, as shown in FIG. 6j, the air bridge 120 is formed in a defined profile as to connect the electrode metal 110' and the pad metal 110, completing the HBT.

Because the electrode metal 110' electrically connects to the air bridge 120, no difficulty is encountered in the contact between the air bridge 120 and the emitter electrode 130. Accordingly, there is no problem in electrically connecting the air bridge with the emitter electrode even if the width of emitter electrode 130 under the electrode metal 110' is reduced.

Figure 7A:
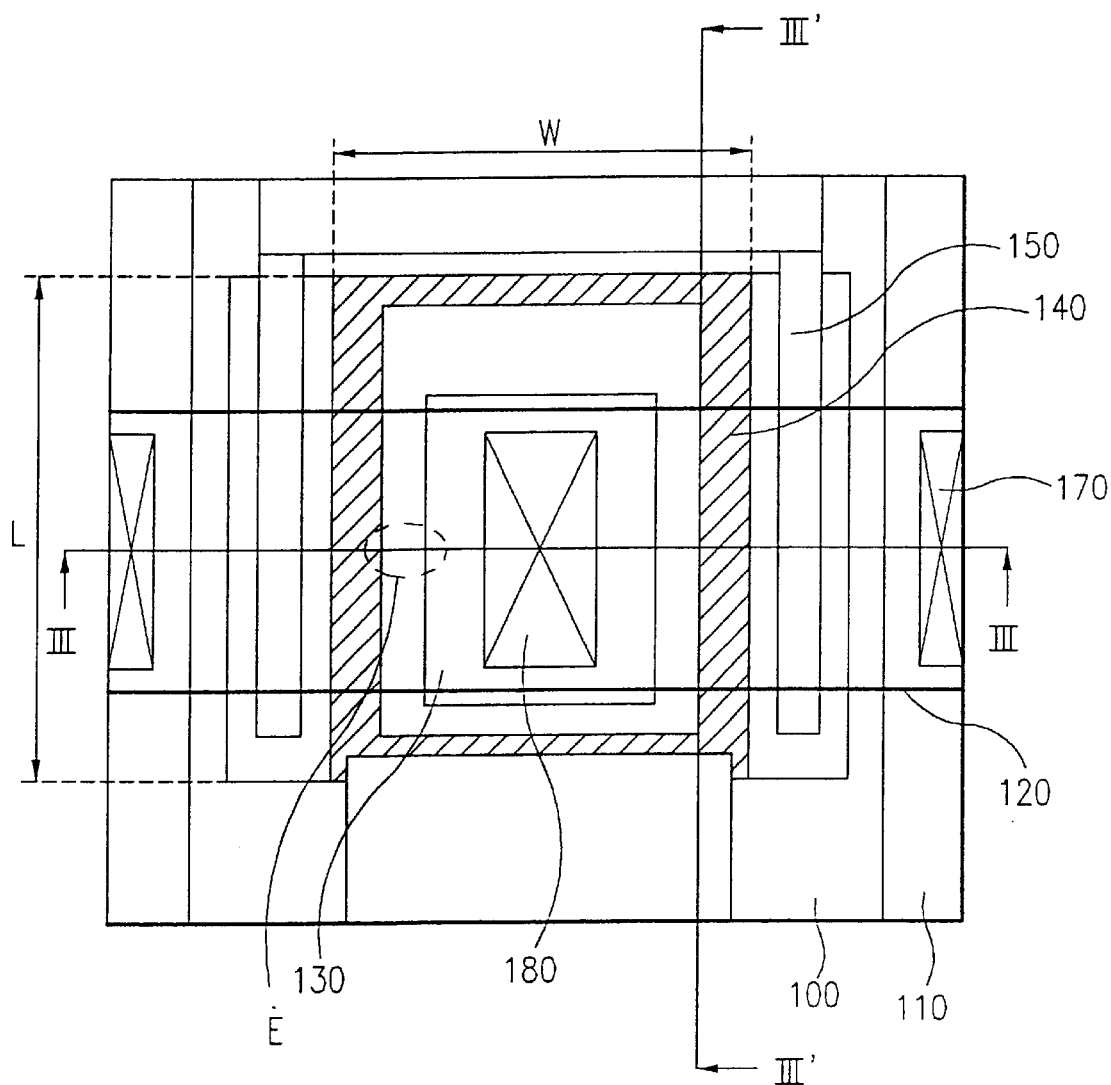
FIG. 7a is a plane view of another embodiment of the HBT according to the present invention.
Figure 7B:
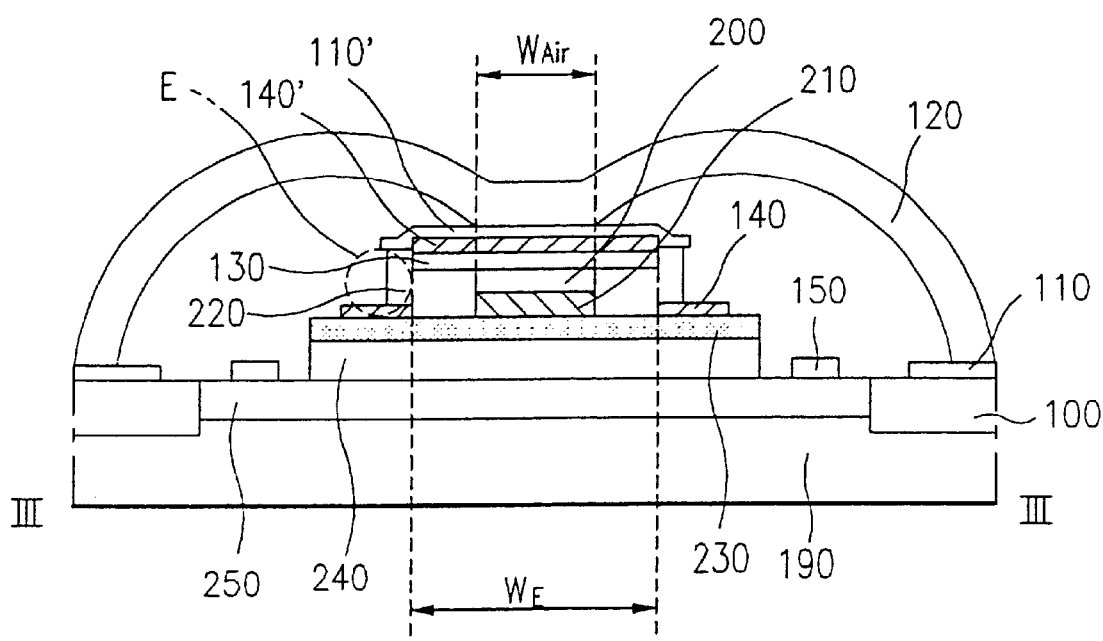
FIG. 7b is a cross-sectional view of FIG. 7a taken along the line III—III.

FIG. 7a is a plane view of a HBT according to the second embodiment of the present invention, and FIG. 7b is a cross-sectional view of FIG. 7a taken along the line III—III. In the second embodiment, the insulating layer 220 is formed on a portion of the base electrode 140 as shown in FIG. 7b. While the insulating layer 220 of the HBT shown in FIG. 5b covers the entire surface of base electrode 140, the insulating layer 220 of the HBT in FIG. 7b covers a portion of the base electrode 140.

Figure 9:
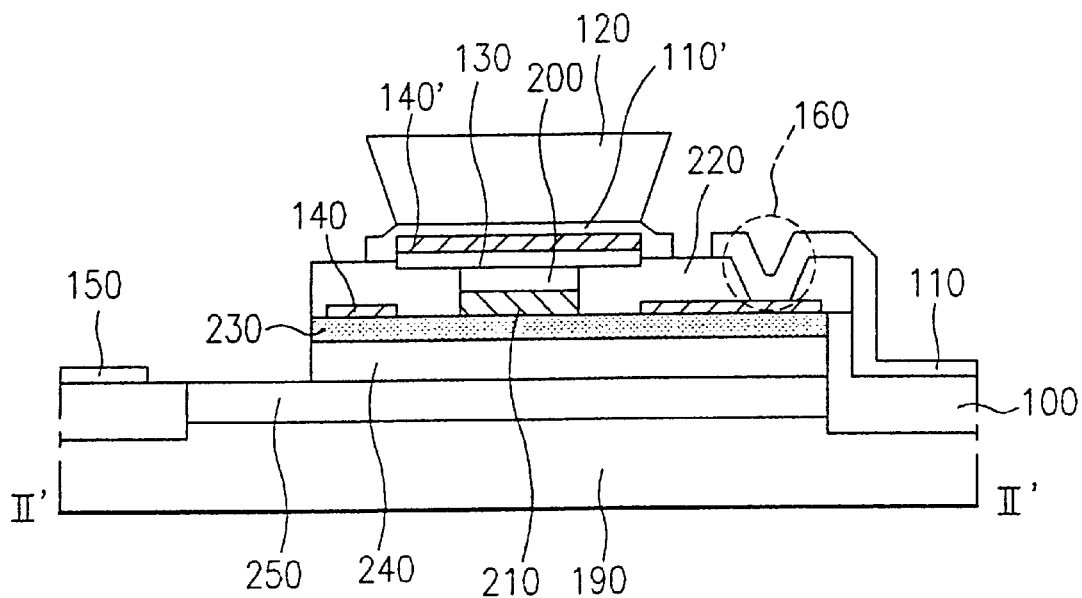
FIG. 9 is a cross-sectional view of FIG. 5a taken along the line II'—II'.
Figure 10:
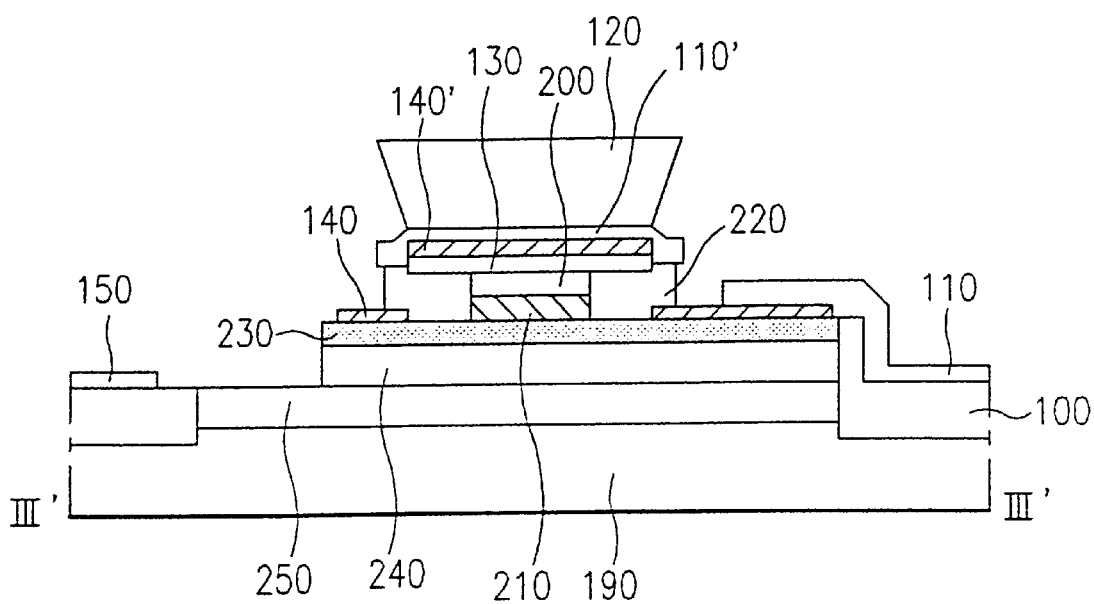
FIG. 10 is a cross-sectional view of FIG. 7a taken along the line III'—III'.

The difference in the insulating layer affects the method for connecting the pad metal 110 and the base electrode. Particularly, the HBT of FIGS. 5a and 5b has the pad metal 110 connected to the base electrode 140 via a contact hole 160 over the insulating layer 220 having the base electrode deposited thereon, shown in FIG. 9. On the other hand, the HBT of FIGS. 7a and 7b has the pad metal 110 directly connected to the base electrode 140 as shown in FIG. 10. Similarly to the HBT of FIGS. 5a and 5b, the pad metal 110 and the electrode metal 110' may consist of the same or different materials.

Figure 8A:
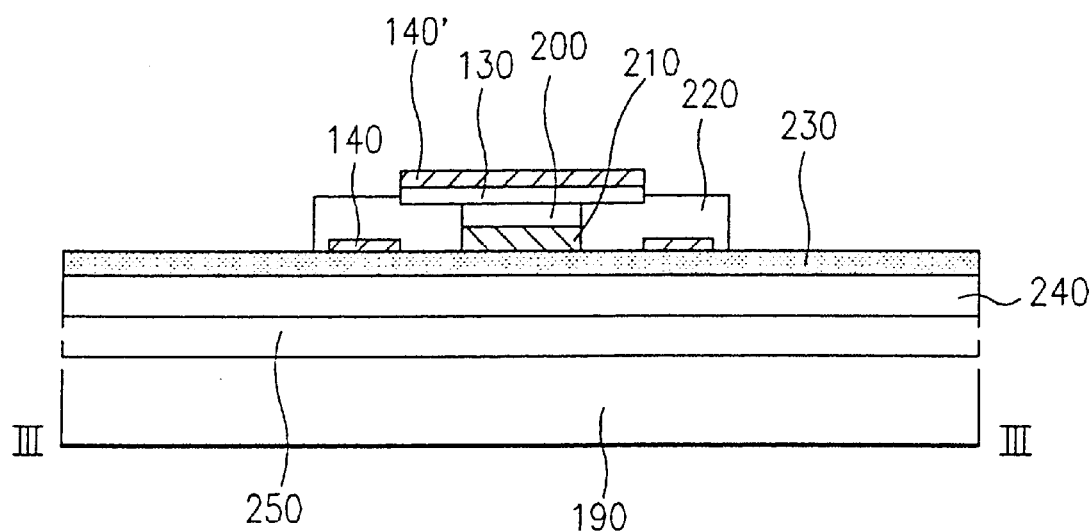
FIGS. 8a to 8e are cross-sectional views illustrating a fabrication process for the HBT in FIG. 7b.
Figure 8B:
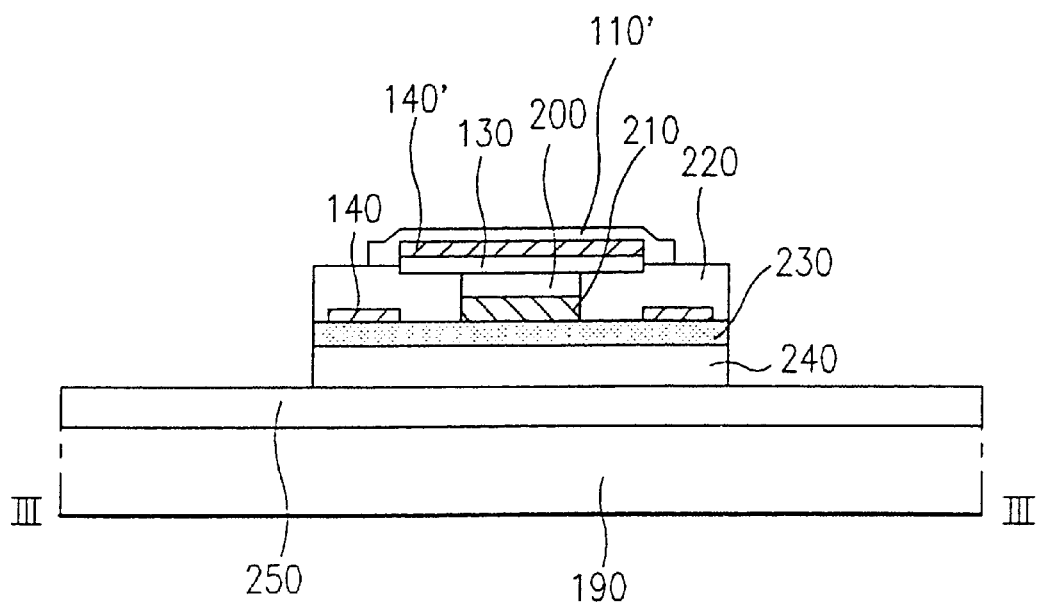

FIGS. 8a–8e are cross-sectional views illustrating a fabrication process for the HBT according to the second embodiment of the present invention. Referring to FIG. 8a, the procedures as described above in reference to FIGS. 6a–6h are repeated in the fabrication of the HBT shown in FIGS. 7a and 7b. The second insulating layer 220 and the emitter electrode 130 are used as a mask in etching the base layer 230 and the collector layer 240 to expose the sub-collector layer 250, as shown in FIG. 8b.

Figure 8C:
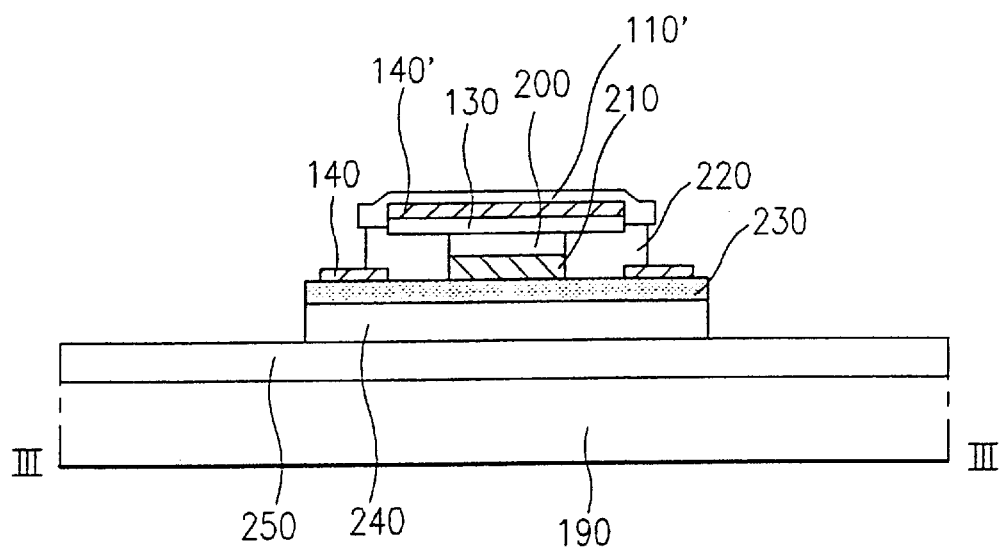

As shown in FIG. 8b, the electrode metal 110' is formed on the second insulating layer 220 to surround the base metal layer 140' on the emitter electrode 130. The second insulating layer 220 and the electrode metal 110' are used as an etching mask to define a base-collector PN junction. As shown in FIG. 8c, the electrode metal 110' is used as a mask in a second etching step for etching the second insulating layer 220. The etching technique utilized is a reactive ion etching using an oxygen plasma.

Figure 8D:
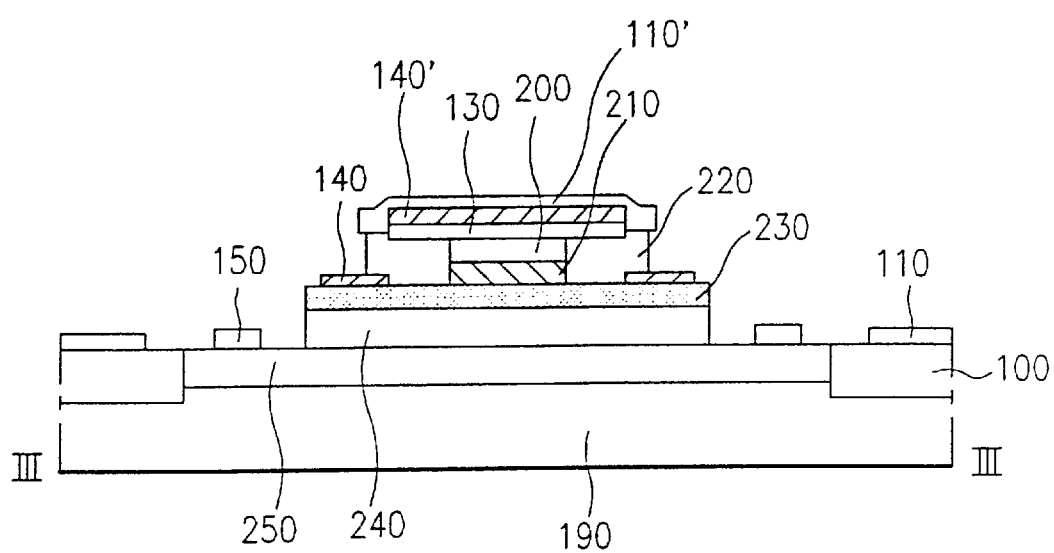
Figure 8E:
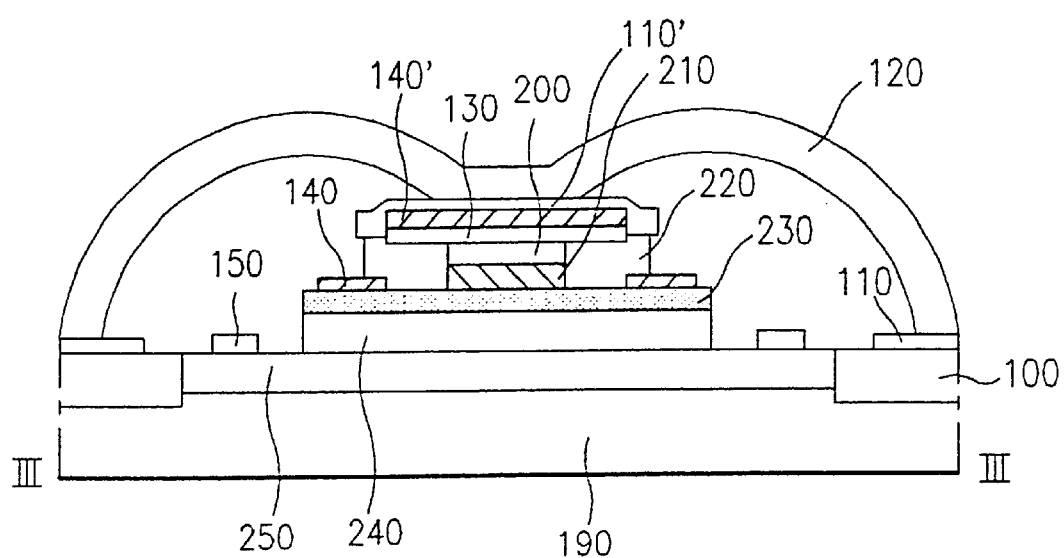

Subsequently, the collector electrode 150 is formed in a defined pattern on the sub-collector 250, and the insulating layer 100 is formed in a defined pattern by injecting ions into the sub-collector layer 250 and the substrate 190. The injection depth of the ions is controlled to a predetermined level sufficient for the ions to be injected into the substrate. As shown in FIG. 8d, the pad electrode 110 is formed on the insulating layer 100. Finally, the air bridge 120 is formed to complete the HBT according to the second embodiment of the present invention, shown in FIG. 8e.

Figure 11A:
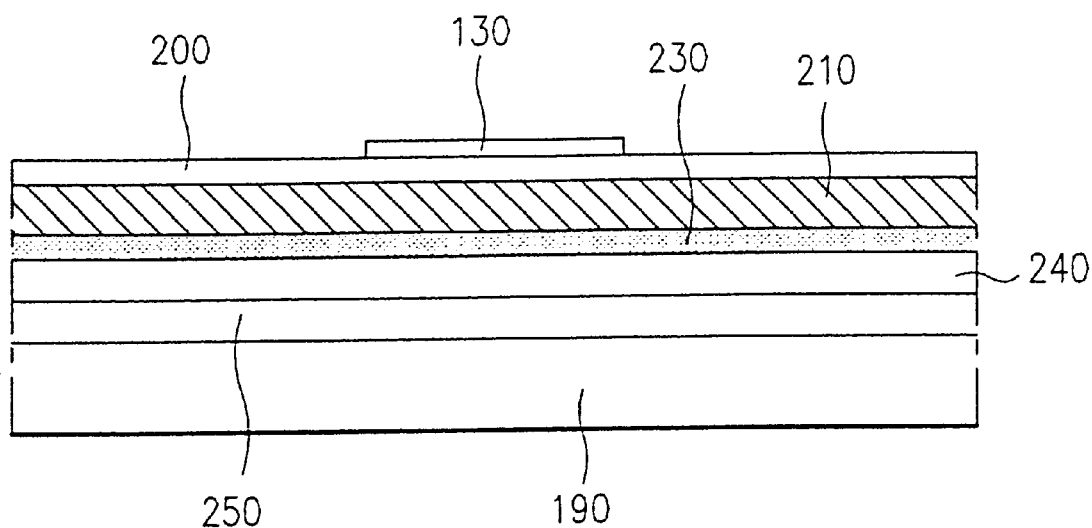
FIGS. 11a to 11l are cross-sectional views illustrating a fabrication process for the HBT according to a third embodiment of the present invention.

FIGS. 11a–11l are cross-sectional views illustrating a fabrication process for a HBT according to the third embodiment of the present invention. As shown in FIG. 11a, a sub-collector layer 250, a collector layer 240, a base layer 230, an emitter layer 210 and an ohmic cap layer 200 are sequentially and sequentially grown on a substrate 190. An emitter metal is then lift-off patterned to form the emitter electrode 130.

Figure 11B:
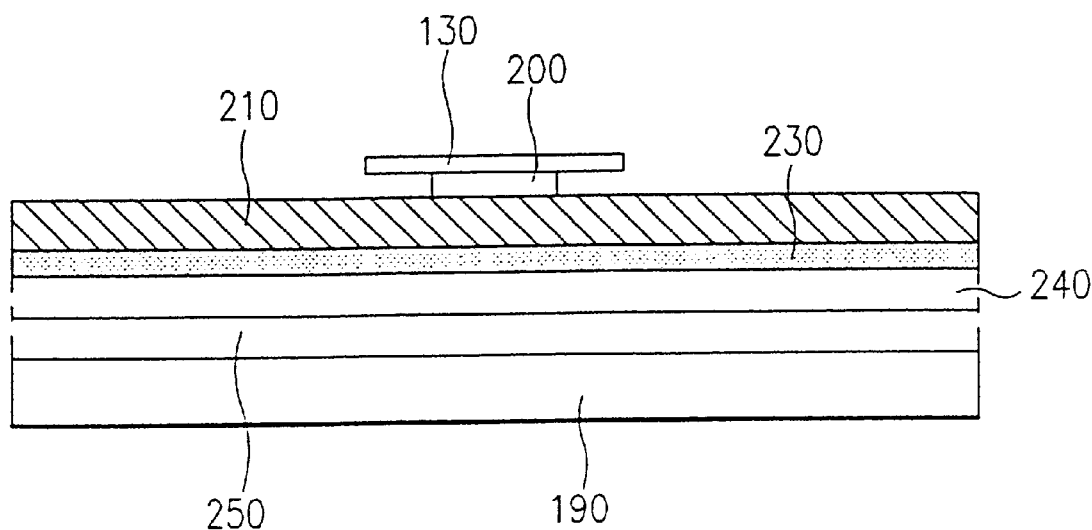
Figure 11C:
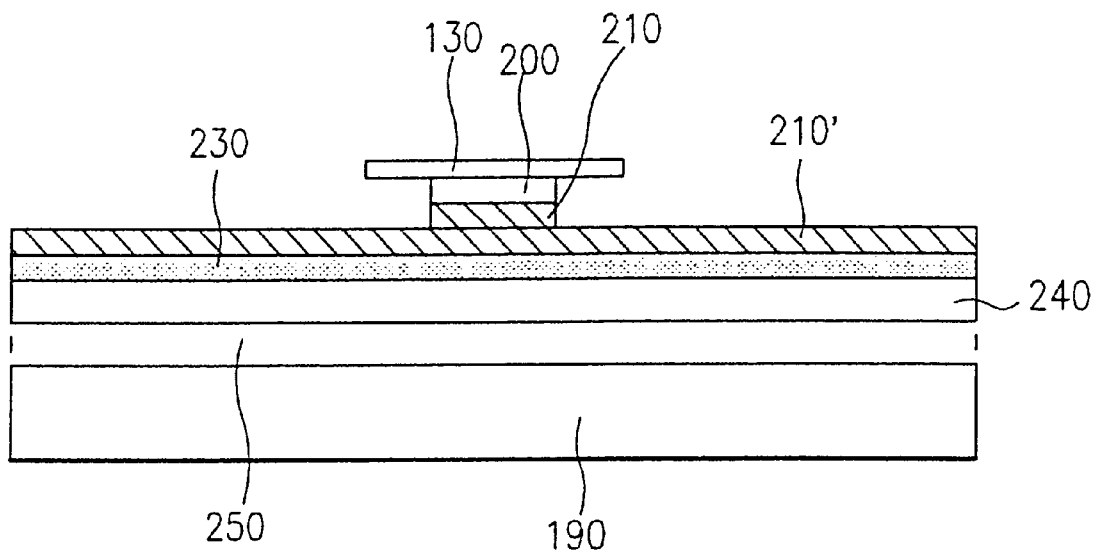

As shown in FIG. 11b, the emitter electrode 130 is used as a mask in etching the ohmic cap layer 200 underlying the emitter electrode 130 to expose the emitter layer 210. The etching technique is a reactive ion etching using a Cl and F-based plasma. The depth of the undercut under the emitter electrode 130 is controlled during this stage by a predetermined depth. The emitter layer 210 exclusive of the emitter layer underlying the patterned ohmic cap layer 130 is wet-etched as deep as the predetermined depth. The remaining emitter layer is the emitter layer 210 underlying the patterned ohmic cap layer and the depleted emitter layer 210', as shown in FIG. 11c.

Figure 11D:
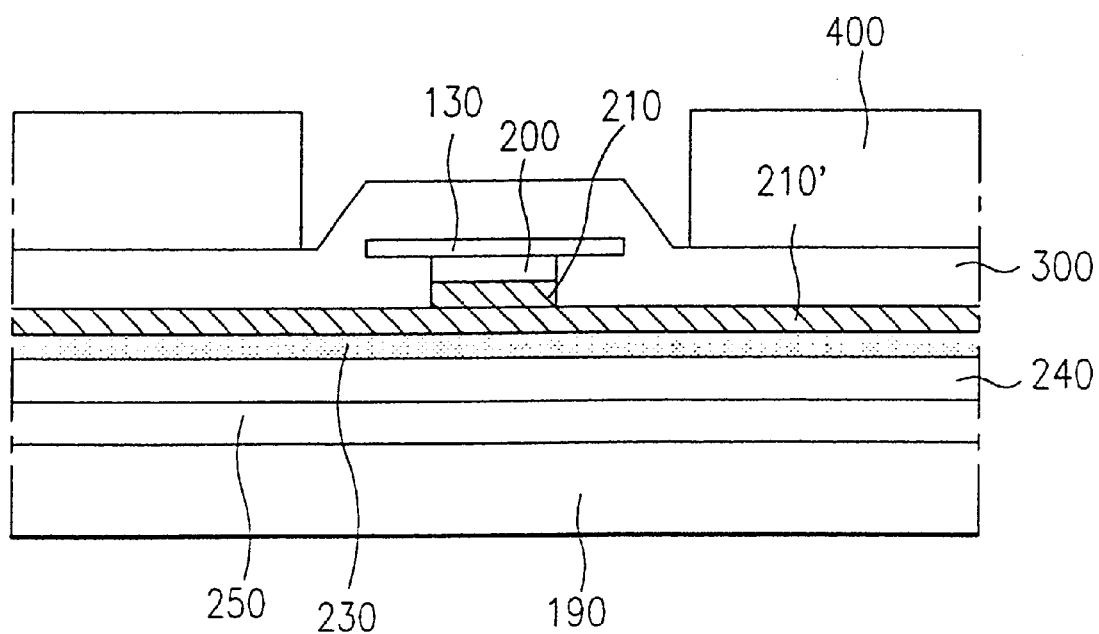
Figure 11E:
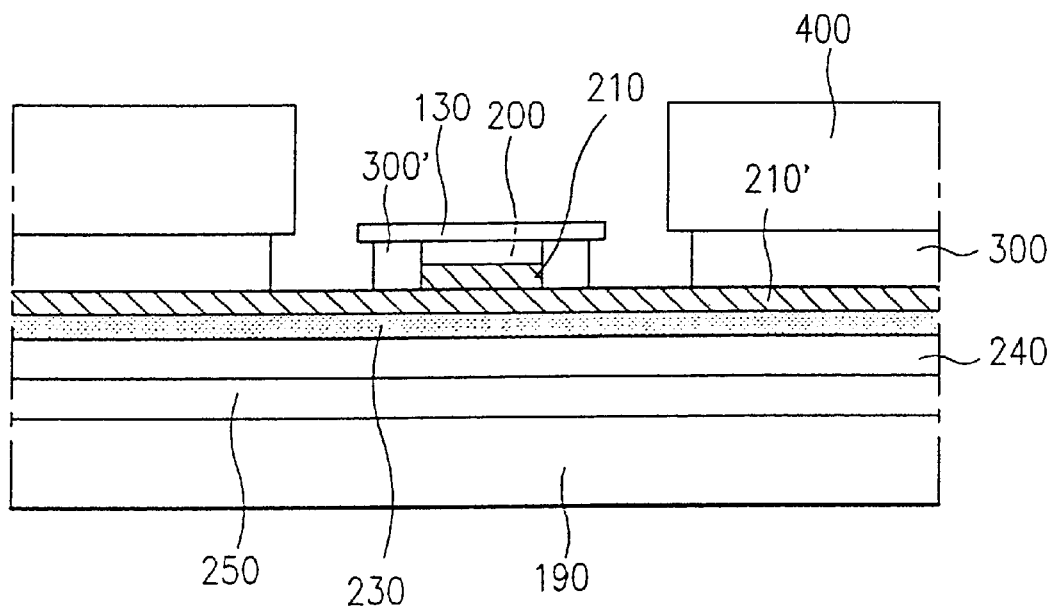

After the formation of the depleted emitter layer 210', a silicon oxide layer or silicon nitride layer is deposited to form a first insulating layer 300, and a photoresist 400 is formed in a defined pattern on the first insulating layer 300, shown in FIG. 11d. The photoresist 400 and the emitter electrode 130 are used as a mask to etch the first insulating layer 300, such that a sidewall 300' of the first insulating layer remains in the form which surrounds the ohmic cap layer 200 and the emitter layer 210, as shown in FIG. 11e.

Figure 11F:
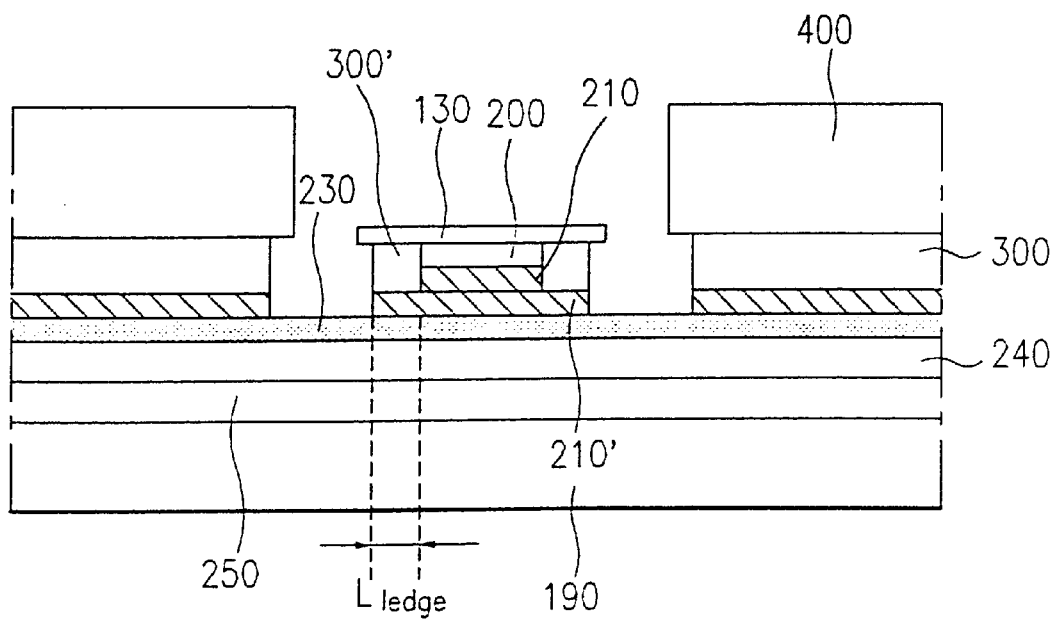
Figure 11G:
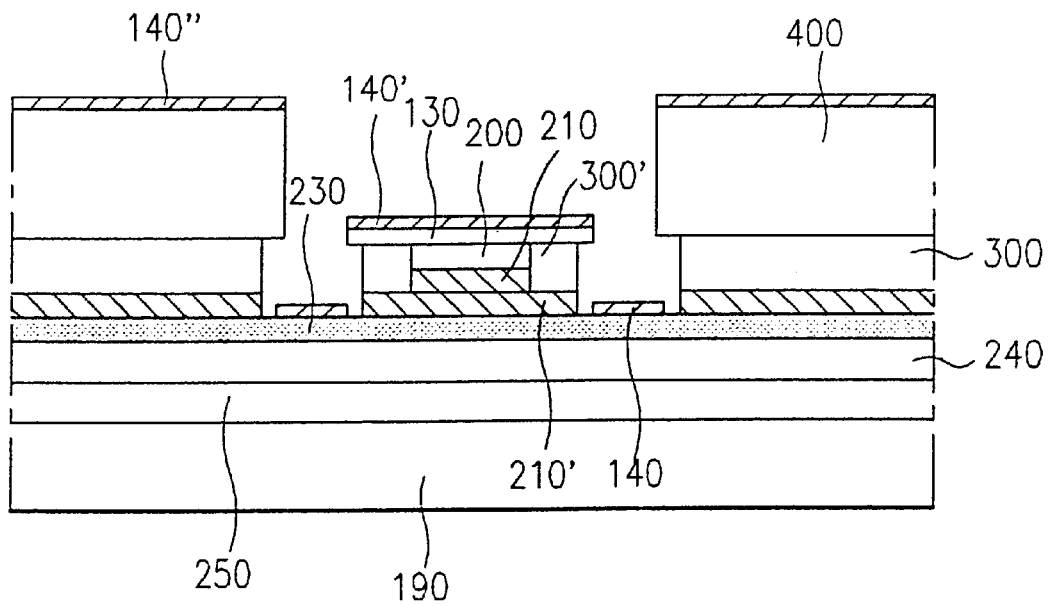
Figure 11H:
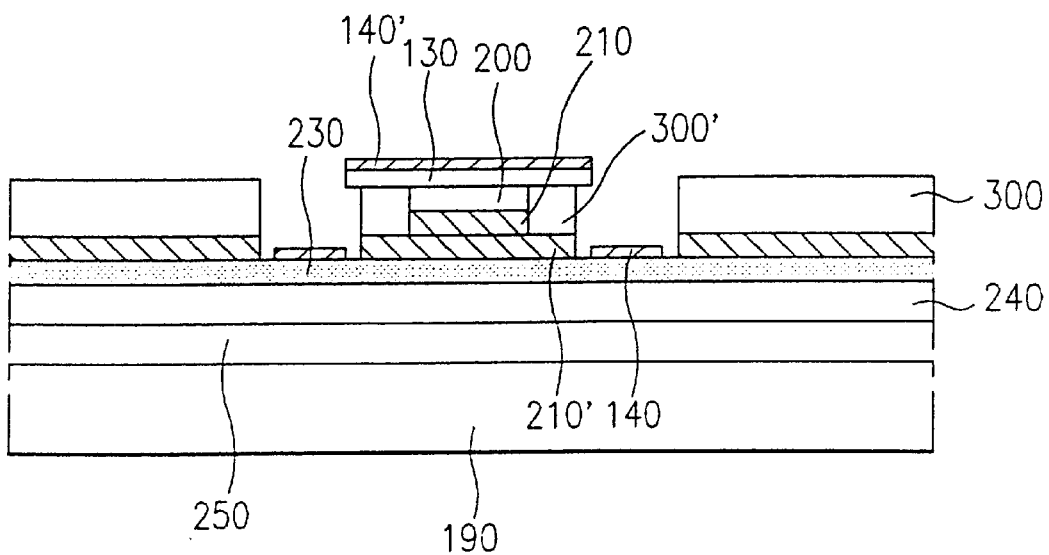

Subsequently, the depleted emitter layer 210' is wet-etched to expose a portion of the base layer 230, shown in FIG. 11f. As shown in FIG. 11g, a base metal is deposited on the entire surface to form a base electrode 140 on the base layer 230 and simultaneously to form a base metal layer 140' on the emitter electrode 130. The base electrode 140 is self-aligned by the patterns of the emitter electrode 130 and the photoresist 400.

Figure 11I:
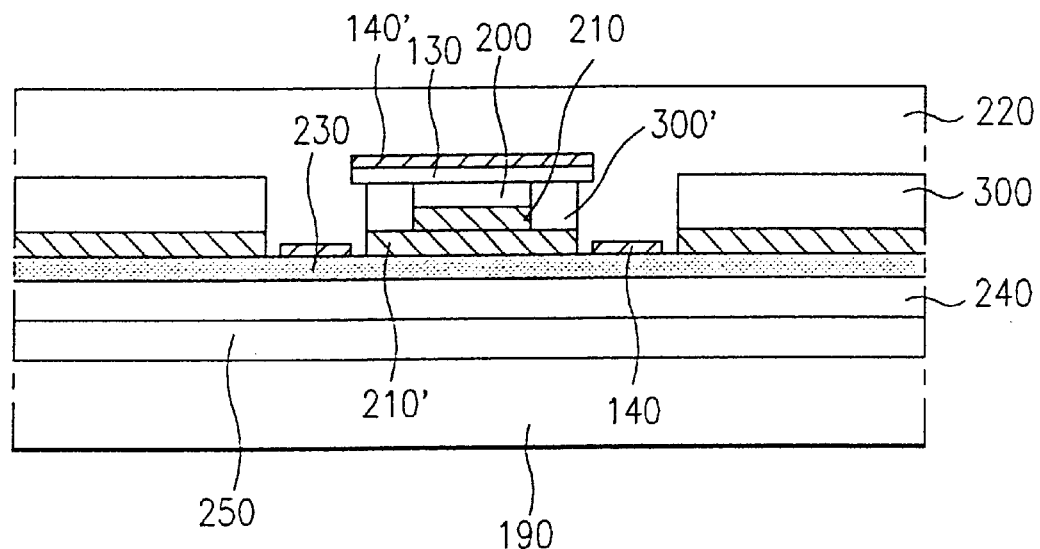
Figure 11J:
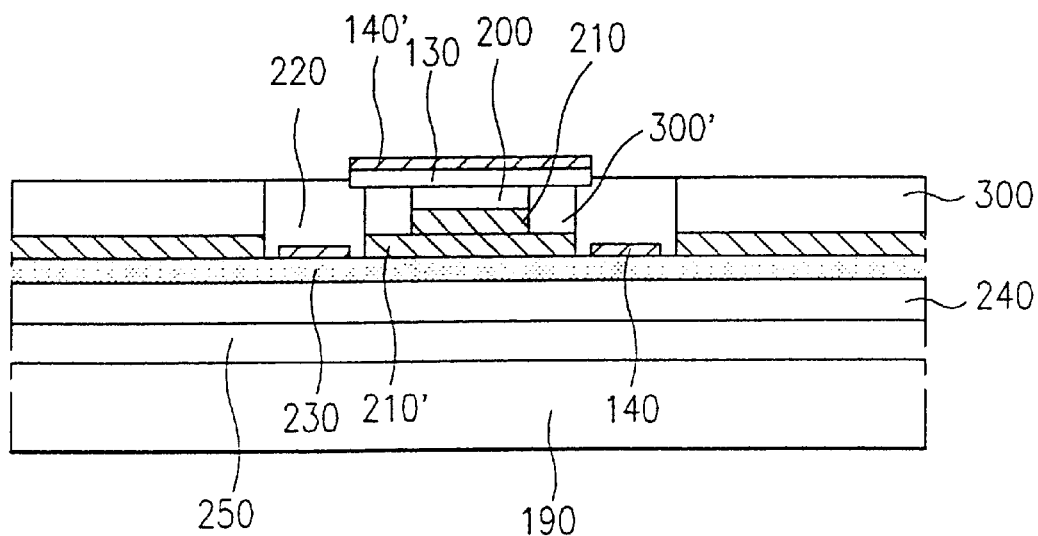

The photoresist 400 and the overlying metal layer 140" are removed (FIG. 11h), and the entire surface is coated with a second insulating layer to be planarized (FIG. 11i). As shown in FIG. 11j, the second insulating layer 220 is gradually etched by a reactive ion etching using an oxygen plasma until the surface of the first insulating layer 300 is exposed. The reactive ion etching is stopped when the surface of the first insulating layer 300 is exposed. The first insulating layer 300 and the emitter electrode 130 are used as a mask to etch the underlying layers to expose the sub-collector layer 250.

Figure 11K:
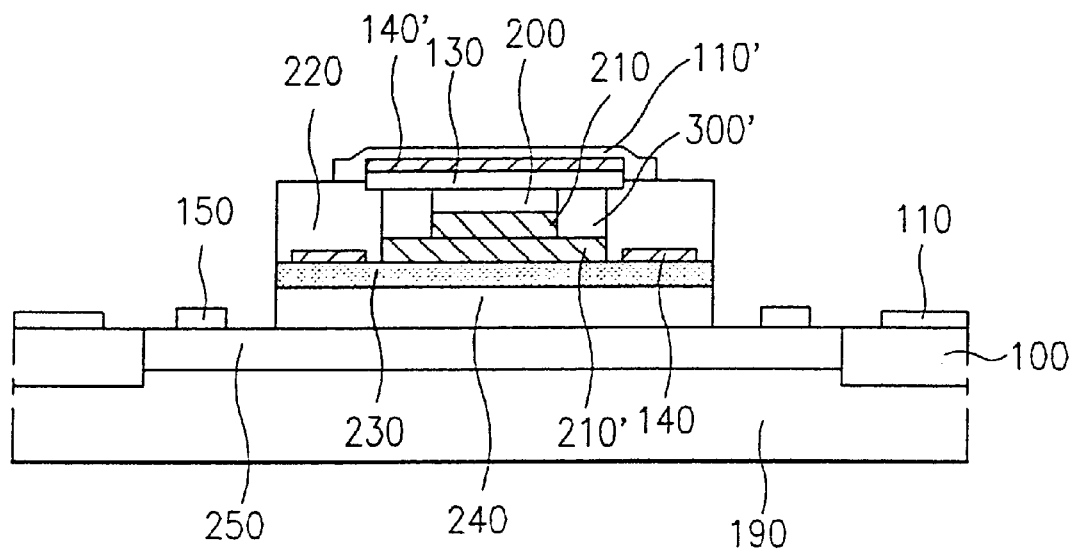
Figure 11L:
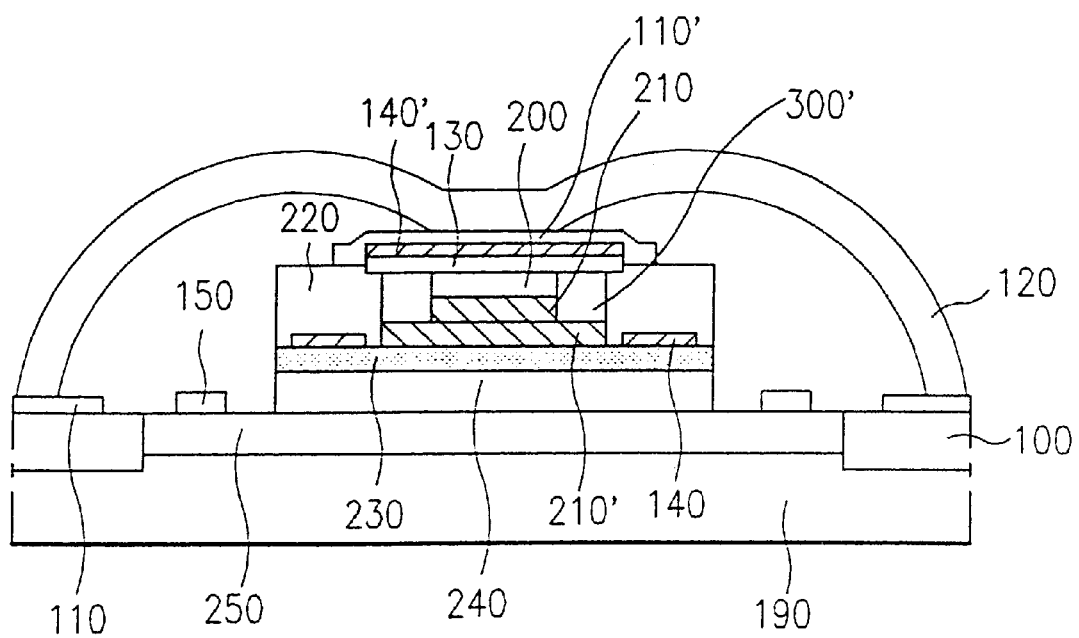

Thereafter, a collector electrode 150 is formed in a defined profile on the sub-collector 250, and ions are injected into both the sub-collector layer 250 and the substrate by a predetermined depth to form an insulating layer 100. As shown in FIG. 11k, a pad metal 110 is formed in a defined profile on the insulating layer 100. An electrode metal 110' is also formed on the second insulating layer 220 as to surround the base metal layer 140'. Finally, an air bridge 120 is formed as shown in FIG. 11l to complete the HBT.

The third embodiment of the HBT has the a same structure as the first embodiment of the HBT with the exception of a first insulating layer sidewall 300' surrounding the ohmic cap layer and the emitter layer, and a depleted emitter layer 210' located under the first insulating layer. The fabrication procedures of FIG. 11i–11l are also analogous to those of FIGS. 6f–6j of the first embodiment.

Particularly, the depleted emitter layer 210' is formed in a defined profile on a portion of the base layer 230. The first insulating layer 300' surrounds the emitter layer 210 and the ohmic cap layer 200 with a height as high as the emitter layer 210 on the depleted emitter layer 210', while the second insulating layer is formed higher than the top surface of the ohmic cap layer 200 on the base layer 230 and the base electrode 140. "L" shown in FIG. 11f indicates the width of the depleted emitter layer 210' extending outside the boundary of emitter layer 210. The ledge (emitter surrounding band structure) protects the surface of the base layer 230, reduces 1/f noise and enhances the life time of the device.

Thus, the third embodiment forms a ledge structure having a thin and depleted emitter layer around the emitter in a manner of self-alignment without a separate mask. Accordingly, a recombination of the base surface is reduced, enhancing the reliability of the HBT.

FIGS. 12a–12g are cross-sectional views illustrating a fabrication process for a HBT according to a fourth embodiment of the present invention. The procedures as described above in reference to FIGS. 11a–11d are repeated in the fabrication of the HBT shown in FIG. 12a.

Figure 12A:
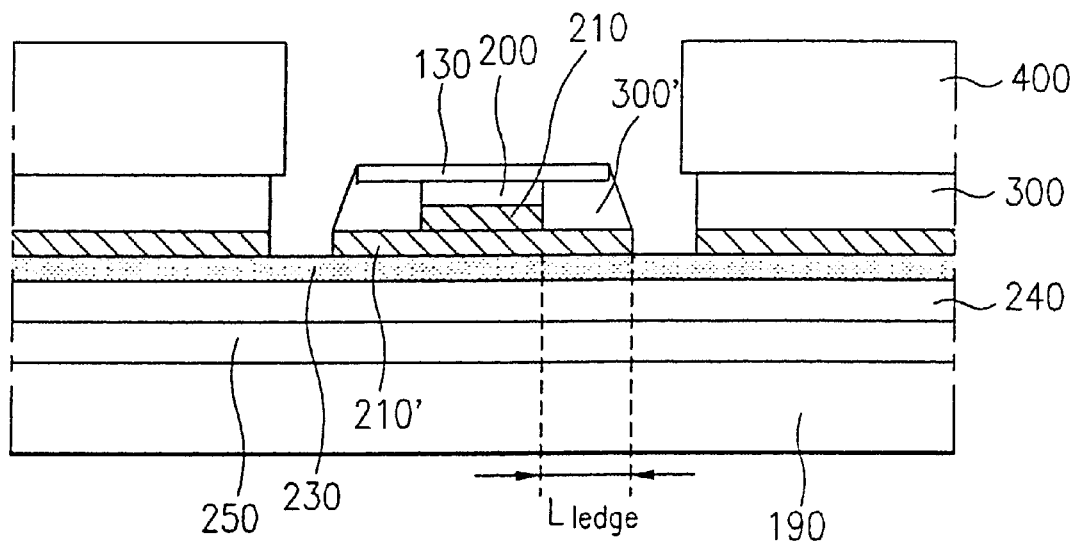
FIGS. 12a–12g are cross-sectional views illustrating a fabrication process for the HBT according to a fourth embodiment of the present invention.
Figure 12B:
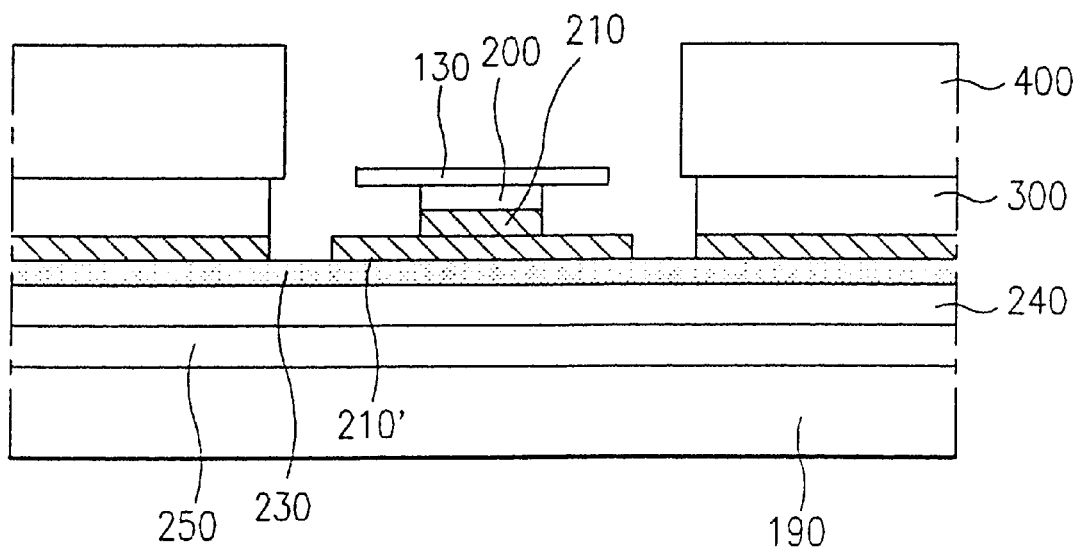

Subsequently, the photoresist 400 and emitter electrode 130 are used as a mask in etching a first insulating layer 300 and a depleted emitter layer 210', as shown in FIG. 12a. The ledge L of the depleted emitter layer 210' extends outside the pattern of the emitter electrode 130. As shown in FIG. 12b, the first insulating layer 300 overlying the ledge 210' of the depleted emitter and underlying the emitter electrode 130 is removed. The removal of the first insulating layer 300 is carried out by an F-based reactive ion etching.

Figure 12C:
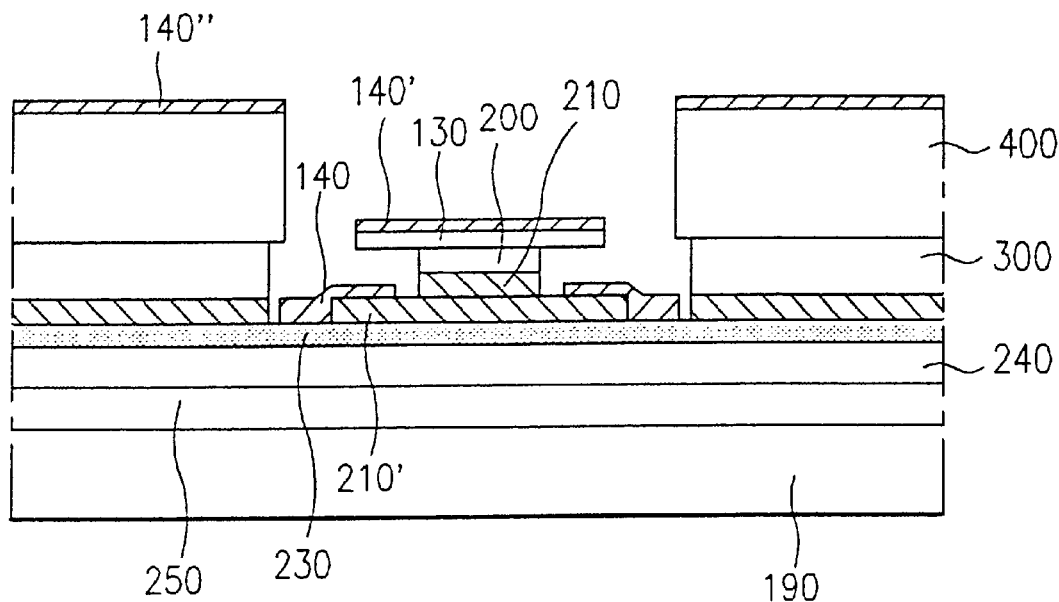

Following the removal of the first insulating layer 300, a base metal is deposited on the entire surface to form a base metal layer 140' and the base electrodes 140 (FIG. 12c). The base electrode 140 is self-aligned by means of the patterns of the emitter electrode 130 and the photoresist 400, and is formed to overlie the ledge 210', extending over the base layer 230. Subsequently, the photoresist 400 and the overlying metal layer 140" are lift off and removed.

The difference from the third embodiment lies in that the ledge of the depleted emitter 210' extends outside the edge of the emitter electrode 130. However, because the first insulating layer sidewall 300' of FIG. 12a is removed, the base electrode 140 is cut off from the emitter electrode 130 at the undercut. Accordingly, the ledge may be controlled arbitrarily in the fourth embodiment of the HBT.

Figure 12D:
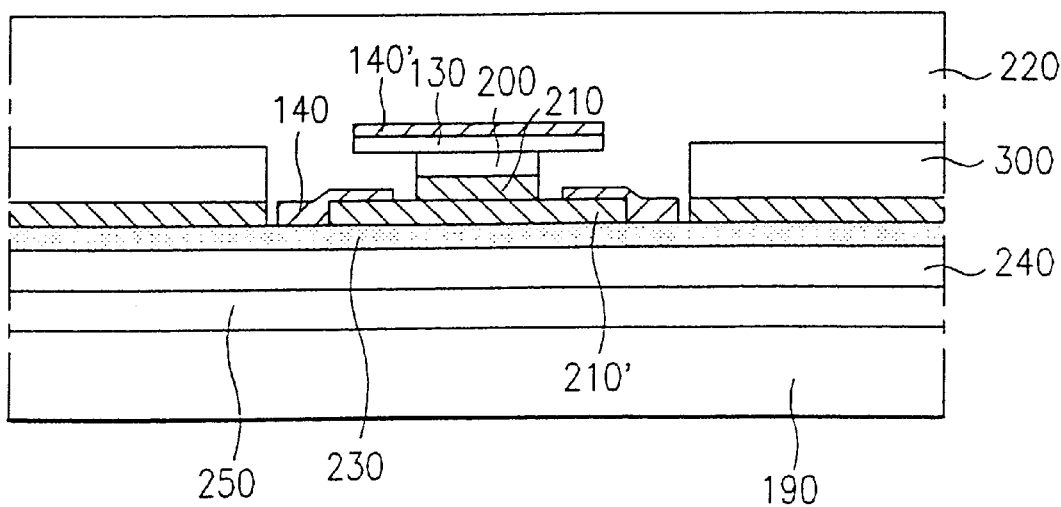
Figure 12E:
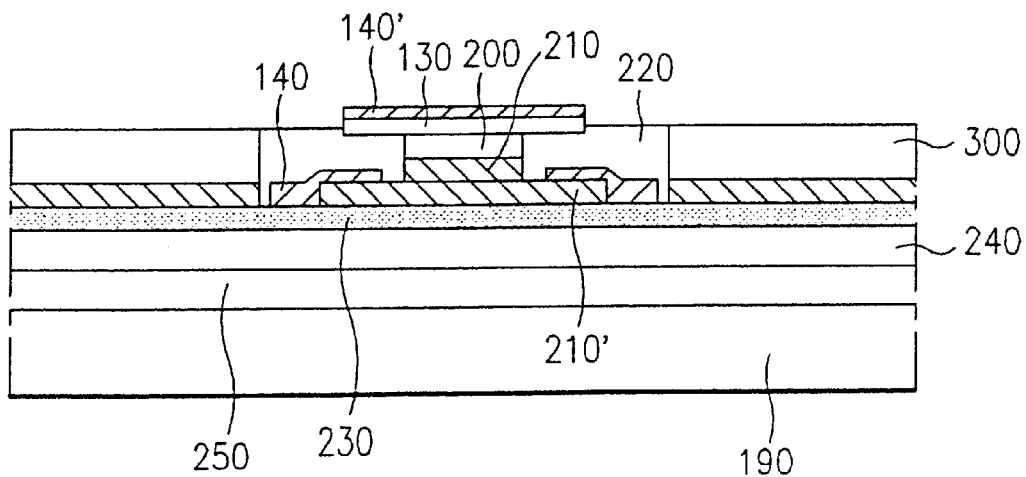
Figure 12F:
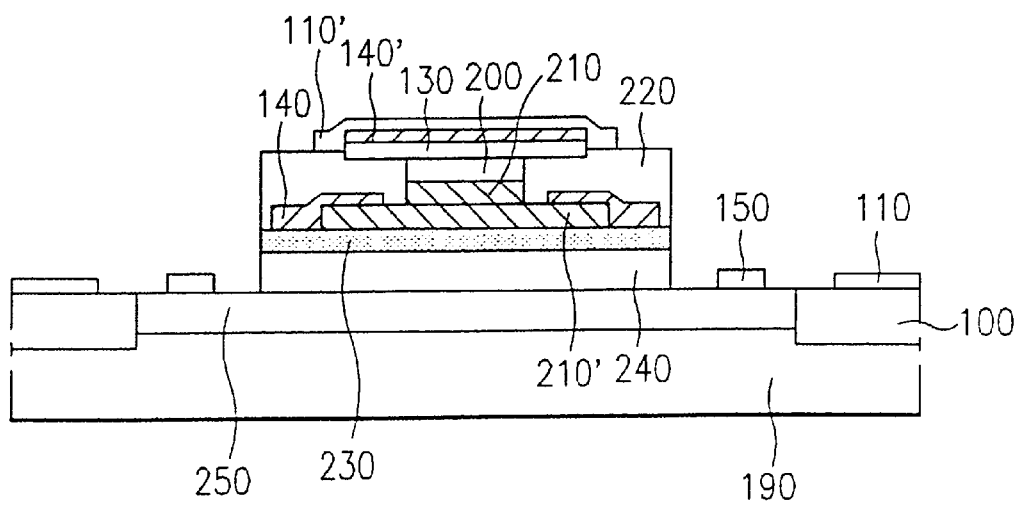
Figure 12G:
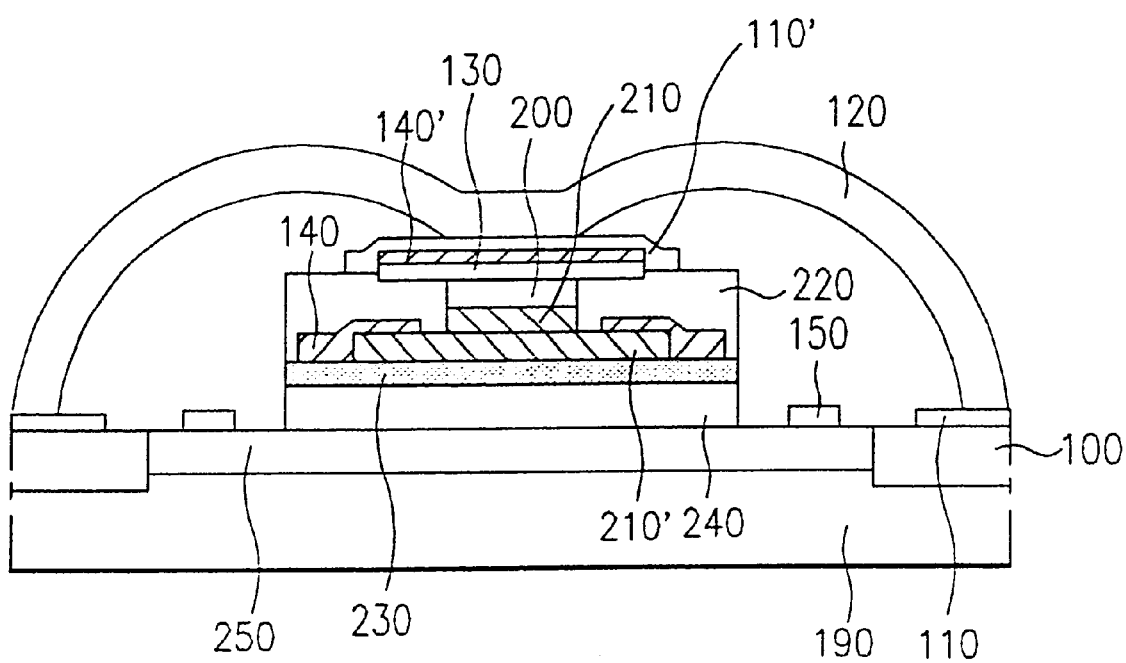

After forming the base electrode 140, the entire surface is coated with a second insulating layer 220 to have the top surface planarized, as shown in FIG. 12d. As shown in FIG. 12e, the second insulating layer 220 is gradually etched until the top surface of the first insulating layer 300 is exposed. The subsequent procedures of FIGS. 12f and 12g are analogous to the procedures described with reference to FIGS. 6h–6j in the first embodiment and will be omitted in the description.

FIGS. 13a–13d are cross-sectional views illustrating a fabrication process for an HBT according to a fifth embodiment of the present invention. The procedures as described above in reference to FIGS. 6a–6i are repeated in the fabrication of the HBT shown in FIG. 13a. However, during the etching procedure for exposing the sub-collector layer 250, over-etching is carried out to form an undercut (indicated by "F" in FIG. 13a) under a second insulating layer 220 and a base electrode 140.

Figure 13A:
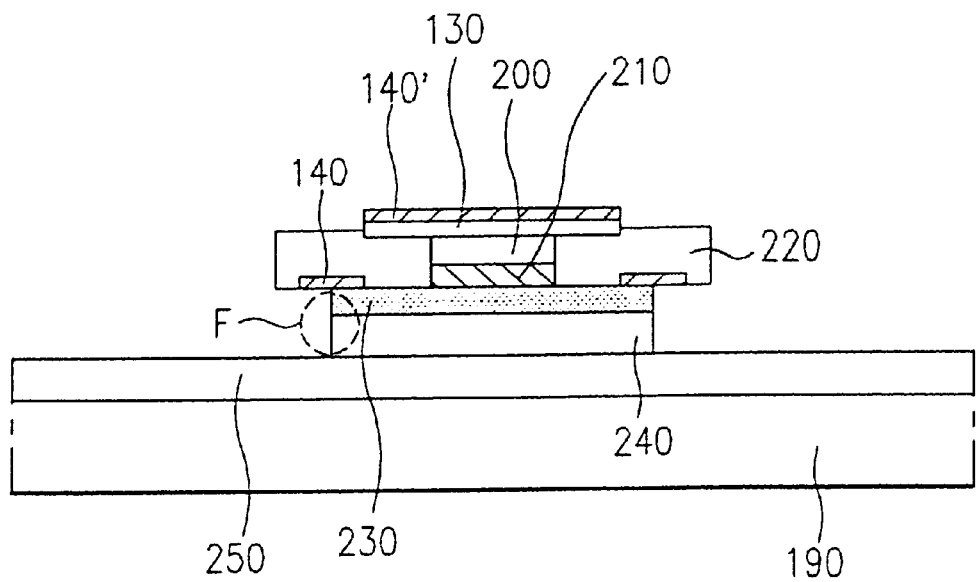
FIGS. 13a–13d are cross-sectional views illustrating a fabrication process for the HBT according to a fifth embodiment of the present invention.
Figure 13B:
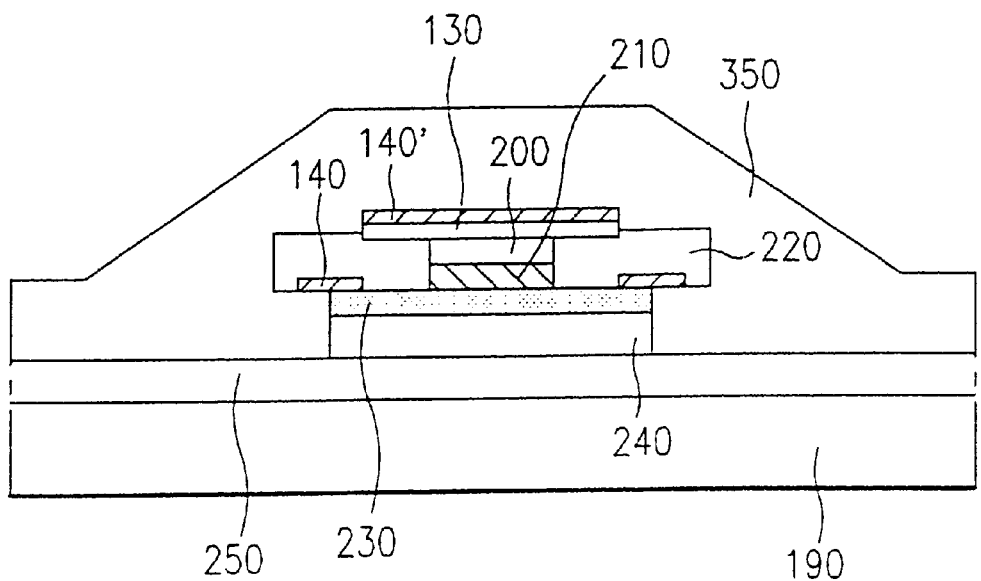
Figure 13C:
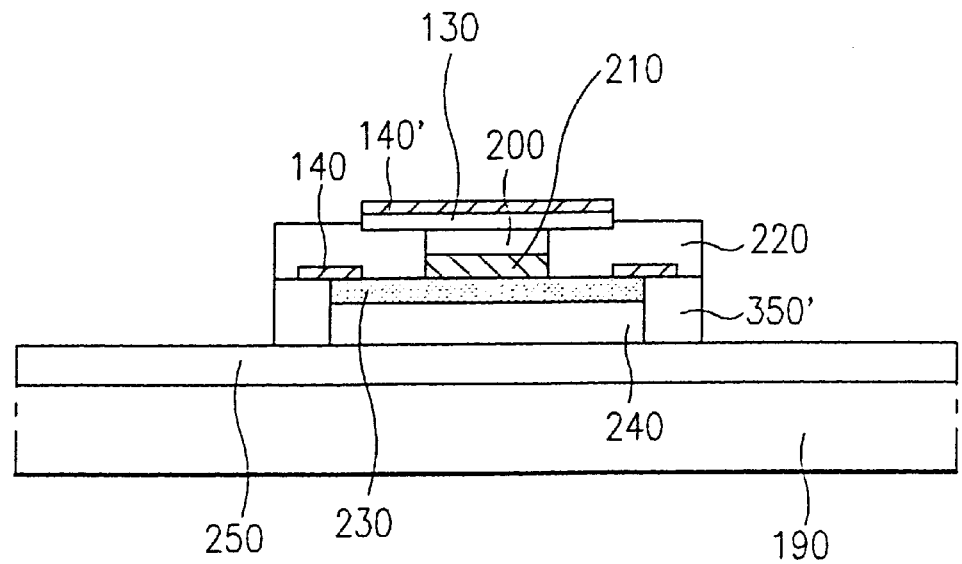

Subsequently, a third insulating layer 350' is deposited on the entire surface of the substrate, as shown in FIG. 13b. The second insulating layer 220 and the emitter electrode 130 are used as a mask in etching the third insulating layer 350' by an F-based reactive ion etching, such that the third insulating layer 350' surrounds base layer 230 and the collector layer 240 on the sub-collector layer 250 (FIG. 13c)

Afterwards, the collector electrode 150 is formed on the sub-collector layer 250 and ions are injected into a portion of the sub-collector layer 250 to form the insulating layer 100. The injection depth of the ions is controlled to penetrate into a portion of the substrate under the sub-collector layer 250. The electrode metal 110' is formed surrounding the base metal layer 140' and the emitter electrode 130 on the second insulating layer 220, and at the same time the pad metal 110 is formed on the ion injected insulating layer 100. The electrode metal 110' and the pad metal 110 may or may not consist of the same material.

Figure 13D:
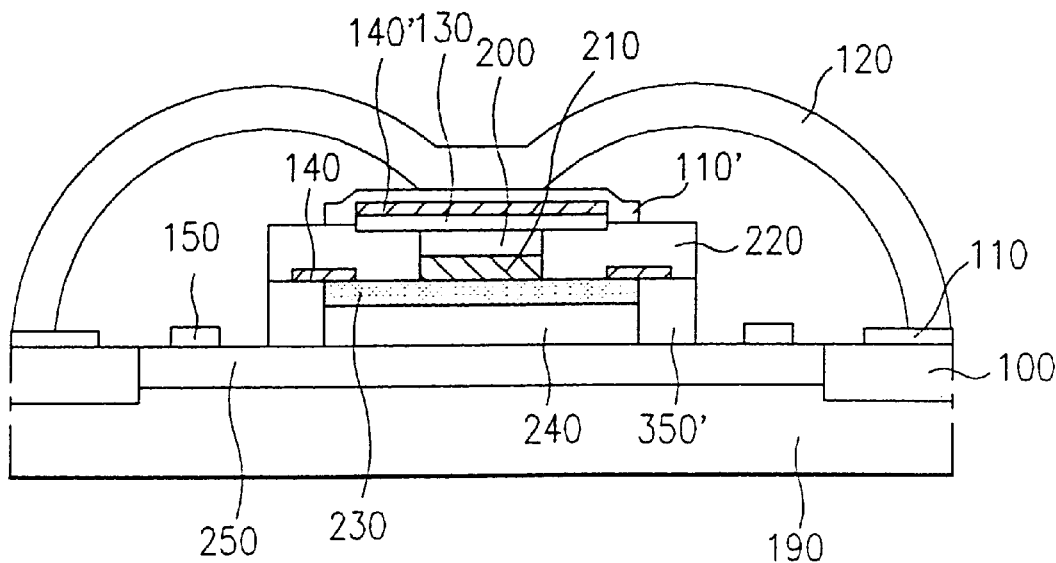

Finally, as shown in FIG. 13d, the air bridge 120 is formed in a defined profile as to connect the electrode metal 110' and the pad metal 110, completing the HBT. The structure of the HBT, as shown in FIG. 13d, can further reduce the width of the base-collector PN junction while maintaining a mechanical stability of the base electrode 140 due to the third insulating layer 350'.

Therefore, the HBT according to the present invention allows a reduction of the width $W_E$ of the emitter and the width W of base-collector junction. Because the insulating layer insulates the base and the emitter electrodes, the electrode metal of the emitter electrode can be overlapped with the base electrode.

Also, part "D" of FIGS. 5a and 5b and part "E" of FIGS. 7a and 7b show an overlap between the electrode metal of the emitter electrode and the base electrode. This overlap allows a further reduction of the width of the emitter electrode. In addition, the ledges shown in FIGS. 11f and 12a, formed in a manner of self-alignment without using a separate mask, maintain a small PN junction and protect the surface of the base layer. This reduces 1/f noise and prolongs the life time of the device.

Moreover, the base-collector PN junction width can be decreased because the base-collector PN junction is formed in a manner of self-alignment. It is also possible to reduce the thickness of the insulating layer deposited for the planarization because the first insulating layer makes the step difference smaller than the prior art and the roughness is not so serious.

Consequently, the control of fabrication process is facilitated when exposing the base metal layer on the emitter electrode by etching the second insulating layer. Unlike the emitter electrode in related art with a small area ratio, the first insulating layer having a high area ratio can be observed at the end of etching the second insulating layer in the present invention. It is also possible to stop the etching automatically because the first insulating layer (e.g., silicon oxide layer or silicon nitride layer) is barely etched by the reactive ion etching which is performed to etch the planarized insulating layer.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a heterojunction bipolar transistor comprising the steps of:
   (a) sequentially forming a sub-collector layer, a collector layer, a base layer, an emitter layer and an ohmic cap layer on a substrate;
   (b) forming an emitter electrode on the ohmic cap layer, and etching the ohmic cap layer and the emitter layer using the emitter electrode as a mask such that an undercut is formed beneath the emitter electrode;
   (c) forming an insulating layer on the entire surface of the substrate, and patterning a mask material formed on the insulating layer in a defined profile;
   (d) etching a portion of the insulating layer using the patterned mask material to expose the emitter electrode and a portion of the base layer;
   (e) forming a base electrode on the exposed portion of the base layer and forming a base metal layer on the exposed emitter electrode;
   (f) removing the mask material, and forming a planarized insulating layer on the entire surface of the substrate;
   (g) etching the planarized insulating layer until the top surface of the insulating layer and the base metal layer is exposed;
   (h) removing the remaining insulating layer, and etching the layers which were underlying the insulating layer using the planarized insulating layer, the base metal layer and the emitter electrode as a mask to expose the sub-collector layer;
   (i) forming a collector electrode on the exposed sub-collector layer;
   (j) forming an isolation region by implanting ions into the outer fringes of the sub-collector layer;
   (k) forming a metal wire on the planarized insulating layer to cover the base metal layer and the emitter electrode; and
   (l) forming an external pad on the isolation region and forming an air bridge to connect the metal wire and the external pad.

2. The method of claim 1, further comprising the step of connecting the pad metal to the base electrode utilizing a contact hole over the planarized insulating layer.

3. The method of claim 1, further comprising the step of etching the planarized insulating layer using the metal wire as a mask to form an overlap between the metal wire and the base electrode, before step (h).

4. The method of claim 3, further comprising the step of directly connecting the pad metal to the base electrode.

5. The method of claim 1, wherein
   in step (b), etching the emitter layer down to a predetermined depth using the emitter electrode as a mask;
   in step (d), etching a portion of the insulating layer and a portion of the emitter layer such that a ledge of the emitter layer is formed extending from the undercut of the emitter electrode, and such that the ohmic cap layer and the emitter layer are surrounded by the insulating layer of a predetermined width; and
   in step (h), removing the remaining insulating layer except the portion surrounding the ohmic cap layer and the emitter layer.

6. The method of claim 1, wherein
   in step (b), etching the emitter layer down to a predetermined depth using the emitter electrode as a mask;
   in step (d), etching a portion of the insulating layer and a portion of the emitter layer such that a ledge of the emitter layer is formed extending from the undercut of the emitter electrode, said ledge extending outside the boundary of the emitter electrode; and
   in step (e), forming a base electrode on the exposed portion of the base layer such that the base electrode overlies said ledge of the emitter layer.

7. The method of claim 1, wherein in step (h),
   removing the remaining insulating layer, and etching the layers which were underlying the insulating layer such that an undercut is formed under the planarized insulating layer; and
   depositing a third insulating layer on the entire surface of the substrate; and
   etching the third insulating layer using the planarized insulating layer and the emitter electrode as a mask such that the third insulating layer surrounds the base layer and the collector layer.

8. The method of claim 1, wherein the thickness of the insulating layer is smaller than the height from the base layer to the top of the emitter electrode and larger than the height from the base layer to the ohmic cap layer.

9. The method of claim 1, wherein the insulating layer consists of either a silicon oxide or a silicon nitride.

10. The method of claim 1, wherein in step (b), the ohmic cap layer is etched by a reactive ion etching technique and the emitter layer is etched by a wet etching technique.

11. The method as claimed in claim 1, wherein in step (e), the base electrode is self-aligned.

12. The method of claim 1, wherein in step (g), the planarized insulating layer is etched by a reactive ion etching using an oxygen plasma.

13. The method of claim 1, wherein in step (f), the planarized insulating layer consists of a polyimide.

* * * * *